United States Patent
Zhang et al.

(10) Patent No.: US 8,685,850 B2
(45) Date of Patent: Apr. 1, 2014

(54) SYSTEM AND METHOD OF PLATING CONDUCTIVE GATE CONTACTS ON METAL GATES FOR SELF-ALIGNED CONTACT INTERCONNECTIONS

(75) Inventors: John H. Zhang, Fishkill, NY (US); Lawrence A. Clevenger, LaGrangeville, NY (US); Carl J. Radens, LaGrangeville, NY (US); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 73 days.

(21) Appl. No.: 13/494,973

(22) Filed: Jun. 12, 2012

(65) Prior Publication Data

US 2012/0313153 A1 Dec. 13, 2012

Related U.S. Application Data

(60) Provisional application No. 61/496,523, filed on Jun. 13, 2011.

(51) Int. Cl.
*H01L 21/3205* (2006.01)
*H01L 21/335* (2006.01)

(52) U.S. Cl.
USPC 438/592; 257/288; 257/E21.17; 257/E21.171; 257/E21.161; 438/587; 438/674; 438/678; 438/680; 438/697

(58) Field of Classification Search
USPC .......... 257/288, 365, E29.255, E21.159, 257/E21.161, E21.17, E21.171; 438/587, 438/592, 674, 678, 697, 680
See application file for complete search history.

(56) References Cited

U.S. PATENT DOCUMENTS

| | | | | |
|---|---|---|---|---|
| 5,728,619 A * | 3/1998 | Tsai et al. | ...................... | 438/297 |
| 6,004,843 A * | 12/1999 | Huang | ........................... | 438/241 |
| 6,391,704 B1 * | 5/2002 | Hong et al. | ................... | 438/241 |
| 6,632,715 B2 * | 10/2003 | Koishikawa | .................. | 438/258 |
| 7,217,657 B2 * | 5/2007 | Wieczorek et al. | ........... | 438/664 |
| 7,235,483 B2 | 6/2007 | Ivanov | | |
| 7,888,742 B2 * | 2/2011 | Cohen et al. | .................. | 257/365 |

(Continued)

OTHER PUBLICATIONS

Fischer, A.C., et al., Selective Electroless Nickel Plating on Oxygen-Plasma-Activate Gold Seed Layers for the Formation of Low Contact Resistance Vias and Microstructures, *KTH Royal Institute of Technology, Stockholm, Sweden*, IEEE 978-1-4244-5764-9/10, 2010, pp. 472-475.

(Continued)

*Primary Examiner* — Allan R Wilson
(74) *Attorney, Agent, or Firm* — Seed IP Law Group PLLC

(57) ABSTRACT

According to one embodiment of the invention, the gate contact is formed by a selective deposition on the gate electrode. One acceptable technique for the selective deposition is by plating. Plating is one process by which a metal structure, such as a gate contact, may be formed directly on the gate electrode. The plating is carried out by immersing the semiconductor die in a plating solution with the gate electrode exposed. The gate contact is plated onto the gate electrode and thus is ensured of being fully aligned exactly to the gate electrode. After this, the appropriate dielectric layers are formed adjacent the gate contact and over the source and drain to ensure that the gate electrode is electrically isolated from other components of the transistor.

8 Claims, 19 Drawing Sheets

(56) References Cited

U.S. PATENT DOCUMENTS

| | | | |
|---|---|---|---|
| 8,558,290 B2* | 10/2013 | Scheiper et al. | 257/288 |
| 2009/0017625 A1* | 1/2009 | Lee et al. | 438/694 |
| 2009/0273035 A1* | 11/2009 | Frohberg et al. | 257/369 |

OTHER PUBLICATIONS

Watanabe, H., et al., "Direct Nickel Plating on Aluminum Substrate for Microbumps Fabrication," *Faculty of Engineering, Kanto Gakuin University*, IEMT/IMC Proceedings, 1987, pp. 101-104.

\* cited by examiner

US 8,685,850 B2

SYSTEM AND METHOD OF PLATING CONDUCTIVE GATE CONTACTS ON METAL GATES FOR SELF-ALIGNED CONTACT INTERCONNECTIONS

CROSS-REFERENCE TO RELATED APPLICATION

This application claims priority to Provisional U.S. Patent Application No. 61/496,523, filed Jun. 13, 2011, bearing the title of SYSTEM AND METHOD OF PLATING OF CONDUCTIVE GATE CONTACTS ON METAL GATES FOR SELF-ALIGNED CONTACT INTERCONNECTIONS.

BACKGROUND

1. Technical Field

The present disclosure relates to interconnections formed within a semiconductor device.

2. Description of the Related Art

Field-effect transistor (FET) manufacturers typically use a self-alignment technique of the gate electrode to the source and the drain of a transistor that ensures proper alignment of the gate between the source and the drain. After this, a gate contract is connected to the gate electrode through a via formed in a dielectric layer over the gate, source and drain. The gate contact is aligned to couple with the gate electrode using photolithographic steps, including a photoresist and reticule. The reticule must be properly aligned with the transistors previously formed on the die to ensure proper electrical contact to the gate electrode.

Misalignment of the contacts to the gate electrode may result in a number of problems. For example, the misalignment of a gate contact may result in a highly resistive connection between the first metal layer and the gate electrode, leading to slower switching times due to RC time delays. In addition, misalignment of a gate contact may result in an inability to apply a voltage to the gate sufficient to operate the FET.

Design rules for semiconductor fabrication processes govern the placement of gate contacts. Gate contacts are typically designed with a buffer between the edge of the contact and the edge of the gate to compensate for error tolerances in photomask alignment. However, as the semiconductor manufacturers continue to explore the use of processes that are below 32 nm, the proper alignment of photomask alignment tools become an increasingly more challenging problem to overcome.

BRIEF SUMMARY

According to one embodiment of the invention, the gate contact is formed by a selective deposition on the gate electrode. One acceptable technique for the selective deposition is by plating. Plating is one process by which a metal structure, such as a gate contact, may be formed directly on the gate electrode. The plating is carried out by immersing the semiconductor die in a plating solution with the gate electrode exposed. The gate contact is plated onto the gate electrode and thus is ensured of being fully aligned exactly to the gate electrode. After this, the appropriate dielectric layers are formed adjacent the gate contact and over the source and drain to ensure that the gate electrode is electrically isolated from other components of the transistor.

The plating solution may include the selected metal, such as nickel, tungsten, copper, and in addition, water and sodium hypophosphite. Within the solution, during the plating process, the gate contact is formed in electrical contact with the gate electrode without the use of a mask and therefore, the gate contact is exactly aligned with the gate electrode without any error that might result from the use of photolithographic steps or alignment tools. It is therefore not necessary to form a mold or apertures in dielectric layers above the gate electrode using a photolithographic process.

There are other techniques to perform selective deposition of the gate contact, another example of which is selective deposition of tungsten on a tungsten gate electrode acting as the seed layer. Other techniques can also be used for such selective deposition.

According to another embodiment of the invention, after the gate contact, source contact, and drain contact are formed, the contacts may be simultaneously opened for connection to a metal layer. This simultaneous opening is facilitated by forming the gate contact from a different metal than the source and drain contacts. Because the source and drain contacts may have a greater height than the gate contact, the metal from which the gate contact is formed may be used as an end of etch indication layer during the chemical-mechanical planarization (CMP) step.

DETAILED DESCRIPTION

As used herein, the term "contact" is used in the broadest meaning of the word for electrical connections and includes within its meaning both contacts and vias between various layers in an integrated circuit. The term "contact" also includes providing electrical contact between any electrical components that are part of the integrated circuit. "Via" will be used in its standard meaning to refer to electrical connections formed between conductive layers in which all of the layers are above the silicon substrate. Thus, the use of "contact" includes a structure used to connect a metal layer to a non-metal region in the silicon substrate as well as various layers to each other.

Figure 1:
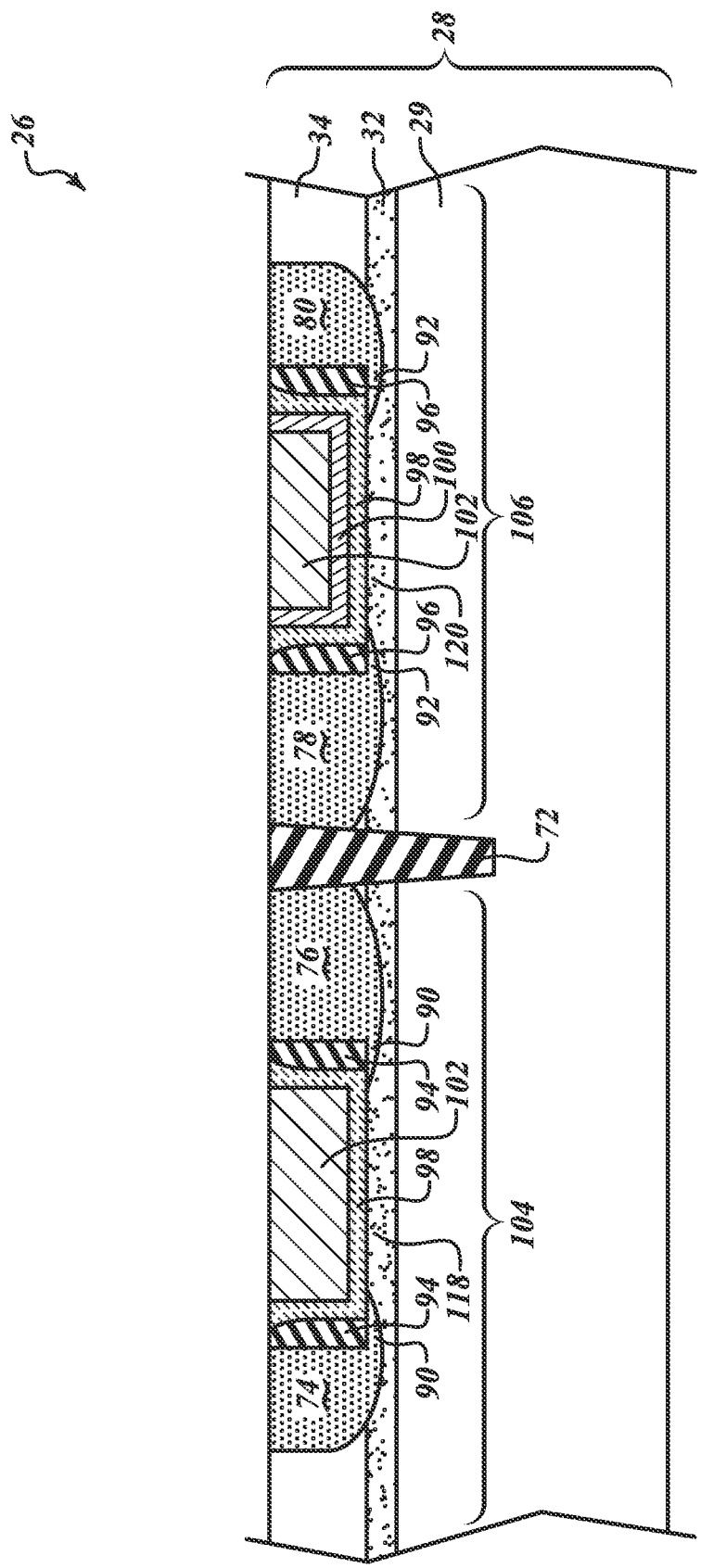
FIG. 1 illustrates a structure in which the present invention can be used.
Figure 9:
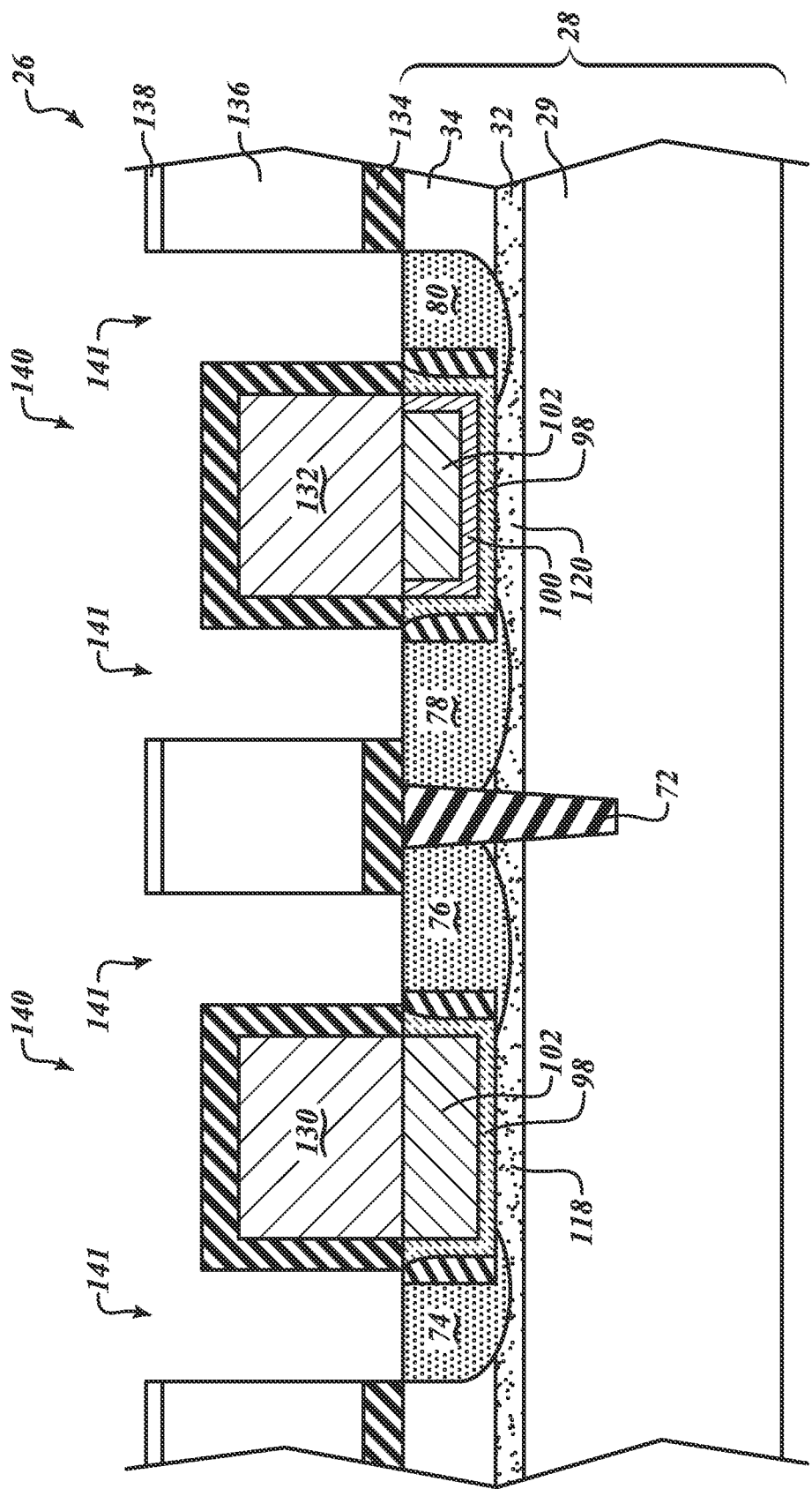

FIG. 1 illustrates a simplified cross-sectional view of a semiconductor device 26 that corresponds to FIG. 9 of an application filed on the same day as this application naming the same inventors. The co-pending application bears U.S. application Ser. No. 13/494,965, and describes in detail a method of forming a transistor having a recessed gate as well as the final structure of the recessed gate transistor. FIG. 1 is not prior art because it was invented by the same inventors as the present invention and is filed on the same day. The present invention uses the transistor formed in this co-pending application as one example of the starting point for providing the selected deposition of contacts according to one embodiment of the invention. While the present invention may be used with a number of different transistor designs, one acceptable example in which the invention is useful is the recessed gate transistor as shown in this application. The principles as taught are particularly useful for very small line widths, under 30 nm, and can be applied to any small scale transistor.

Semiconductor device 26 includes two field effect transistors (FETs) 104 and 106 separated by trench isolation 72 and formed in wafer 28. Wafer 28 includes a first silicon layer 29, a separating layer 32, and a second silicon layer 34. FETs 104 and 106 include gate electrodes 102.

Wafer 28 includes multiple layers, according to one embodiment of the invention. Silicon layer 29 is a monocrystalline layer of silicon that comprises the starting substrate of wafer 28. Alternatively, silicon layer 29 may be a monocrystalline or polycrystalline layer of silicon that is formed over another layer, not illustrated. Separating layer 32 may be formed of silicon-germanium, SiGe, according to one embodiment of the invention. SiGe is a semiconductor that may increase the potential uses of a wafer. For example, a separating layer formed from SiGe may be used as a channel for FET 104 or 106. Separating layer 32 may also be an insulator, such as silicon-dioxide ($SiO_2$) or buried oxide (BOX), such that wafer 28 is a silicon on insulator (SOI) wafer.

Silicon layer 34 may include monocrystalline silicon or polycrystalline silicon formed over layer 32.

Semiconductor processes that are 32 nm and smaller often utilize metal for the gate electrode, Thus, gates 102 are formed of metal. In one embodiment, the gates are formed of aluminum. In another embodiment, the gates are formed of gold, copper, tungsten or nickel. However, according to another embodiment, gates 102 are formed of a non-metallic material, such as polysilicon.

A detailed description of FIG. 1 can be found in the previous application which is incorporated by reference and the structure will be summarized here for ease of reference. Transistor 104 is an n-channel transistor having source and drain regions 74 and 76, respectively, and a channel region 118 in between the source and drain regions. Extensions 90 from the source and drain regions extend partially into the material 32 which is used for the channel region. Sidewalls 94 are positioned between the source and drain and the gate electrode 102. A dielectric layer 98 is positioned between the gate electrode 102 and the channel 118.

MOS transistor 106 is a p-channel transistor having a similar structure. It also includes source/drain regions 78 and 80 and a channel region 120 positioned between them. Source/drain extensions 92 extend into the channel material 32. Sidewalls 96 are positioned adjacent the source and drain region and a gate electrode 102 is positioned between the source and drain and over the channel region 130. A gate dielectric 98 separates the channel from the gate electrode. Since transistor 106 is a p-channel transistor an additional layer of metal 100 which is the p-channel work function metal layer is positioned as one of the metal layers of the gate electrode 102.

In practice, the transistors of FIG. 1 will have a gate length in the range of 20 nm or smaller. In some embodiments, the channel regions will be in the range of 2-5 nm and, therefore, the gate electrodes will be very small, far too small than can be accurately aligned with photolithographic techniques. As will be illustrated in the next FIG. 2, having very small transistors makes it difficult to align the gate contact and the source and drain contacts properly.

Figure 2:
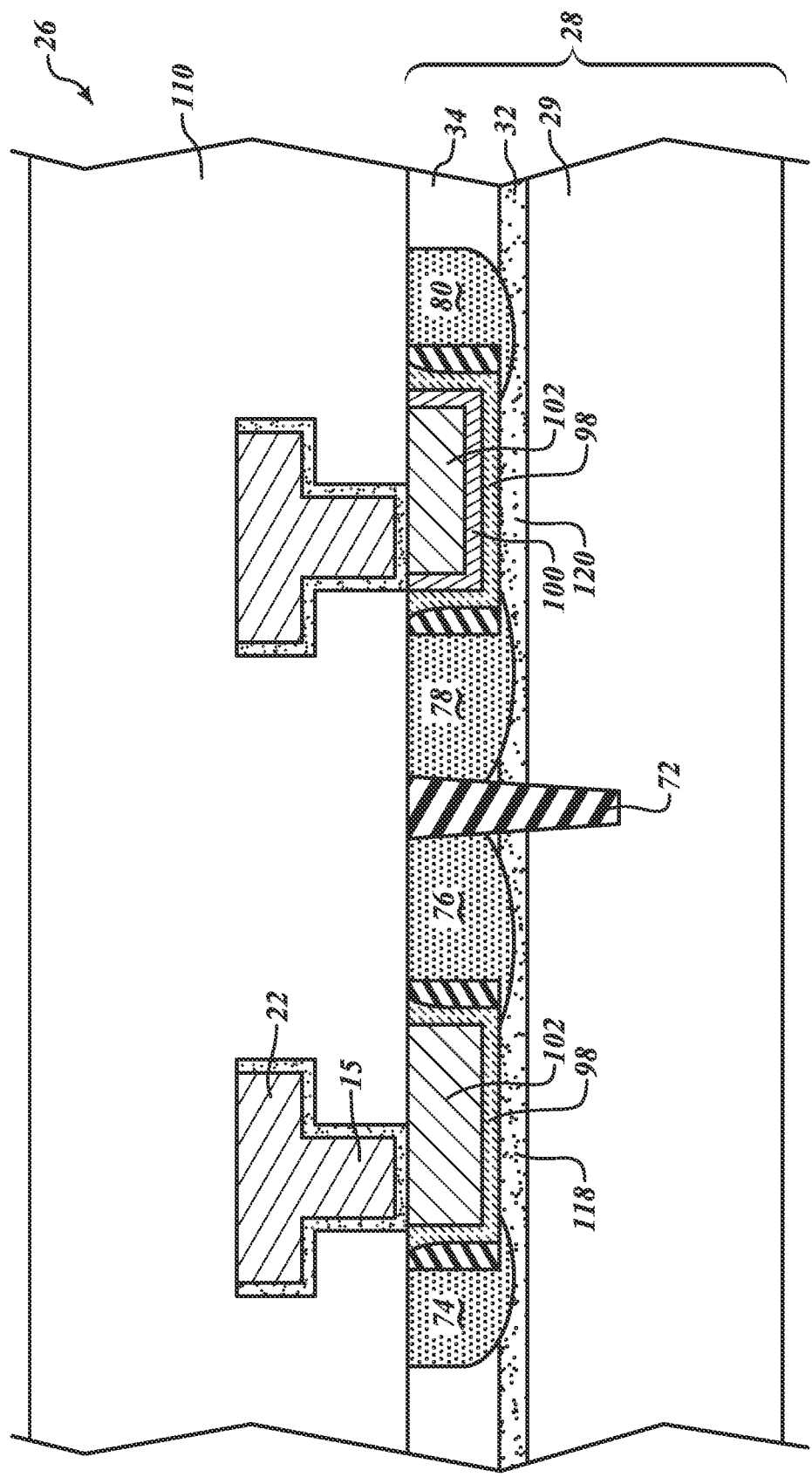
FIG. 2 illustrates problems which may result from using prior art techniques in the structure of FIG. 1.

FIG. 2 illustrates a simplified cross-sectional view of a semiconductor device 26 having misalignment of the gate contact to the gate electrode. Semiconductor device 26 includes contacts 110 that should be positioned on metal gate electrode 102.

As illustrated, contacts 110 are not aligned at the center above gate electrodes 102. The misalignment of contacts 110 may be due to alignment errors in photolithographic and mask alignment tools.

Shrinking semiconductor processes require photomask alignment tools to become more precise. That is, the photomask alignment tools need to be able to produce more closely repeatable alignments for smaller processes to produces reliable semiconductor devices. An amount of error that may have been acceptable for a 45 nm or 65 nm process may cause a contact or via to miss a targeted region, entirely in a 22 nm or smaller device. The problems that may be caused by misalignment include higher contact resistances between metal contact 110 and gates 102, and in some cases, defective circuits. Higher resistances may result in longer RC time constants which may correspond to slower acceptable switching or operating frequencies for FETs 104 and 106.

In this particular embodiment, the problem of the proper alignment is even more difficult because the gate dimension over the channel length is smaller than the smallest photolithographic dimension achievable in this process, so proper alignment without contact to the source/drain will be difficult.

FIGS. 3 to 13 illustrate a method of forming contacts over FETs 104 and 106 of semiconductor device 26, in accordance with an embodiment of the invention.

Figure 3:
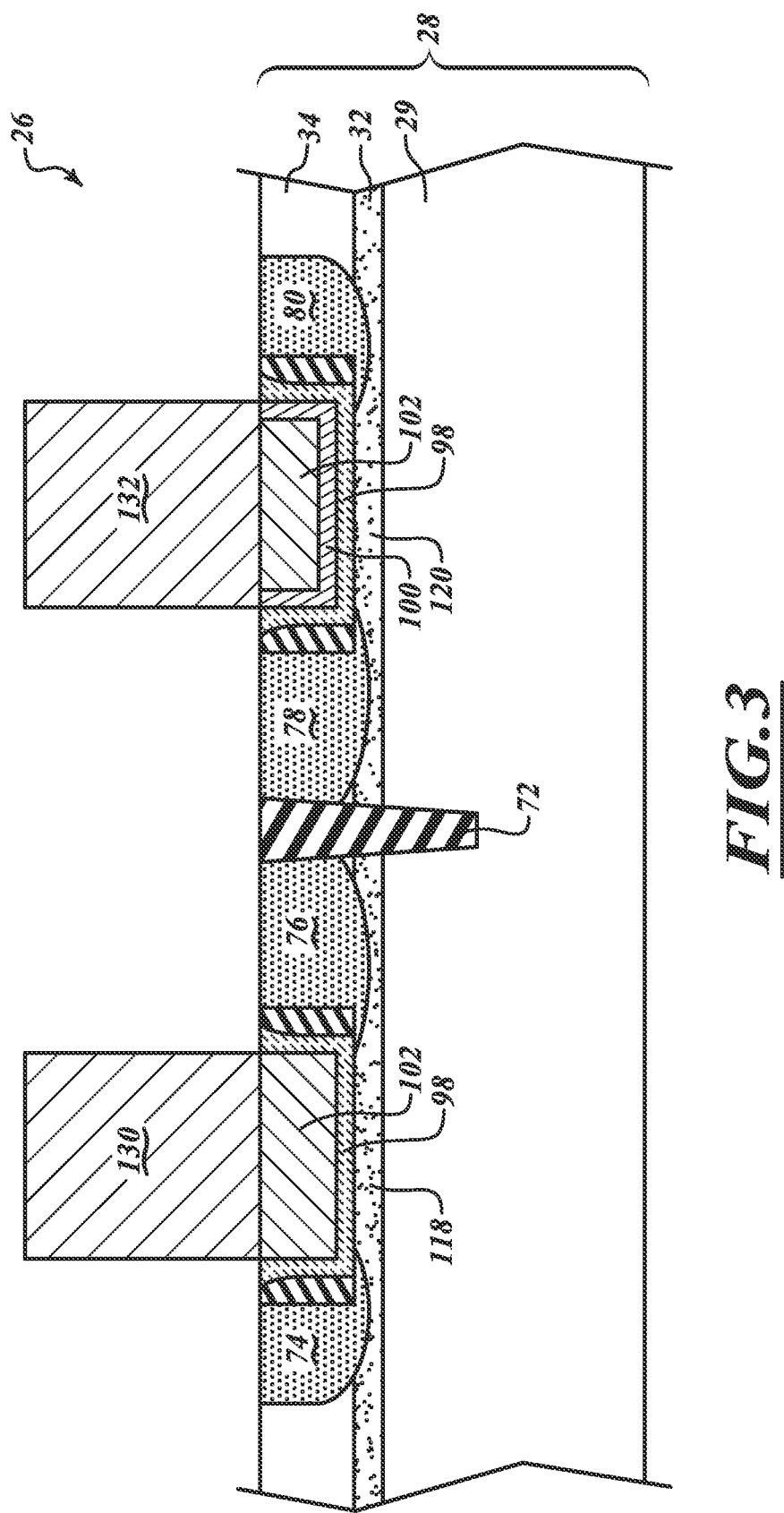
FIGS. 3-13 illustrate one method of forming gate, source and drain contacts as taught herein.

FIG. 3 illustrates the formation of contacts 130 and 132 over gates 102. Contacts 130 and 132 are formed without the use of mask, photolithographic tools, or molds to direct the placement of contacts 130 and 132, according to an embodiment of the invention. Contacts 130 and 132 are selectively deposited. One technique is a plating process. In one embodiment, a standard plating process is used; in another embodiment, an electroless plating. Selective deposition using electroless plating process includes selecting metals for the gate contacts 130 and 132 to be ones that will form only on the exposed gate electrodes to ensure that metal bumps are not formed on all exposed conductors on the die.

One technique for electroless plating is described in an article titled: "Selective Electroless Nickel Plating on Oxygen-Plasma-Activate Gold Seed Layers For the Formation of Low Contact Resistance Vias and Microstructures, by A. G. Fischer et al. of the Royal Institute of Technology, Stockholm, Sweden, published by IEEE under the index code 978-1-4244-5764-9/10 in 2010, incorporated herein by reference.

A second technique for forming direct nickel plating on aluminum is described in another article bearing the title of "Direct Nickel Plating on Aluminum Substrate for Microbumps Fabrication" by Watanabe et al., a member of the Faculty of Engineering of Kanto Gakuin University, published in the 1987 IEMT/IMC Proceedings, pages 101-104, also incorporated herein by reference.

Both of these publications describe techniques by which nickel can be selectively formed on gold or aluminum. Similar articles are published and known in the art for forming copper on a copper seed layer which can be placed over the gate electrodes 102. In addition, selective deposition of tungsten has been published in many articles and is well known in the art. In one preferred embodiment, the gate electrodes 102 are formed of tungsten, in which case, the preferred metal for the gate contacts is also tungsten since there are many well known techniques for selectively depositing tungsten on an existing tungsten and avoiding the deposition of the tungsten in places where the original tungsten is not present using chemical vapor deposition (CVD) techniques. Thus, the type of metal used for the selective deposition process as shown in FIG. 3 will be based at least in part on the type of material used for gate 102. In the case of aluminum for the gate electrode 102, nickel is the preferred plating process. In the case of gold being used for the gate electrode 102, nickel is also preferred while, in those cases in which the gate electrode is made of copper, copper is preferred, and if the gate is made of tungsten, then tungsten is preferred.

At the beginning of a gate contact formation process, gate electrodes 102 are exposed. The semiconductor device 26 is then bathed or dipped into an electroless plating bath, which may include chemicals such as nickel, water, sodium hypophosphite, and/or glycine. If the metal to be deposited is copper, the bath will include copper in place of the nickel, and similar substitutions will be made for other metals. Some of the metal will adhere to gate electrodes 102 to form contacts 130 and 132 extending perpendicular to the plane of the surface of gate electrodes 102. According to one embodiment, gate electrodes 102 are comprised of aluminum or gold and contacts 130 and 132 are formed from nickel. As previously noted, if the gate electrodes 102 are tungsten, then the contacts 130, 132 will be tungsten; or, if they are copper, the contacts will be copper.

Gates 102 may be pre-treated in preparation for the electroless process. Pre-treating seed metals or materials, those upon which the selective deposition will occur, may make the metal better capable of making strong adhesions to the metal used in the electroless bath. The pre-treatment or activation process may include several wet process steps with acids and/or catalyzation agents.

The selective deposition can be done by plating, with or without an electrode coupled to the metal. As is known, electrode plating can be done in the very selective fashion in small geometries and if plating with an electrode is carried out, the appropriate metal connections are made to the gate electrodes on the die and these can be etched away at a later step. Alternatively, electroless plating can be carried out. As a further alternative, selective CVD deposition of tungsten, copper, or other gate contact metals can be performed. If selective CVD deposition is being carried out, the final step in forming the gate electrode may include the appropriate seed layer as the topmost layer on the gate electrode.

The formation of contacts 130 and 132 using selective deposition without molds or masks advantageously eliminates potential issues surrounding misalignment of a gate contact because contacts 130 and 132 are formed using the gate electrodes as the seed layer. Such a process also removes the size constraints of contacts which are put in place by design rules to compensate for error tolerances of photomask alignment tools. As a result, gate contacts may be formed over the entire surface area of the gate electrode, thereby reducing the contact resistance and timing delays associated with smaller contacts and misaligned contacts. Furthermore, the selective deposition process removes the processing steps of having to deposit a mask layer and etch gate openings to protect remaining portions of semiconductor device 26 from a blanket metal deposition. Thus, another advantage of implementing a selective deposition process to form a gate contact is an overall a potentially faster fabrication process.

In the alternative, contacts 130 and 132 may be formed with an electroless process that uses molds, according to another embodiment of the invention. The use of molds in an electroless process may be used to increase the selectivity of the deposition. The molds may be formed by etching patterns in a polymer layer mask, $SiO_2$ mask, or the like to further limit what regions of semiconductor device 26 will be exposed to the electroless plating metal. The use of molds may also facilitate the formation of contacts 130 and 132 by concentrating solution over the area of interest, e.g., gates 102, and thus reduce the time of contact formation.

While the above disclosure applies electroless plating of a metal, such as nickel, to another metal, such as gold or aluminum, it is herein disclosed that that electroless plating techniques can be used to form metal bumps or structures over silicon or other non-metals. Additionally, electroless plating may be used to form dielectric or insulator over metal or to form insulator over silicon or other non-metals. As will be discussed in more detail in connection with FIGS. 7 to 10, structures formed with an electroless plating process may be covered with an encapsulating film, such as silicon-nitride. The encapsulating film can then be used as a stop layer to facilitate the creation of various openings and to mitigate the effects of photomask alignment errors. U.S. Pat. No. 7,235,483 discusses electroless deposition of dielectrics and is hereby incorporated by reference.

Figure 4:
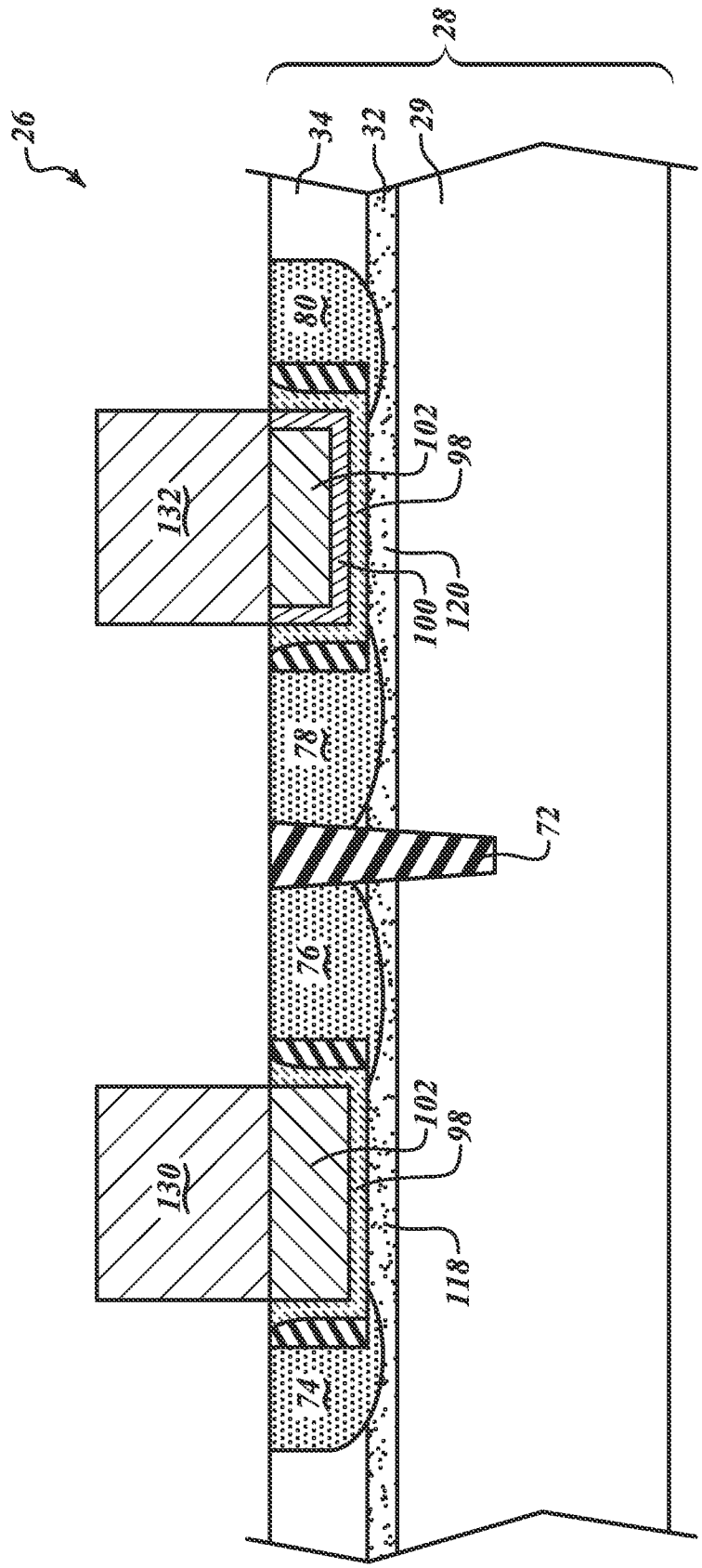

FIG. 4 illustrates a dry or wet cleaning of semiconductor device 26 after the electroless plating process. The dry or wet cleaning removes possible metal residuals that may remain on the non-gate areas as a result of the selective deposition process.

During the selective deposition process to form gate contacts 130 and 132, there will be some minor residue of the metal contact material at different locations on the die. Of course while in a preferred embodiment, the metal will form only on the desired locations, from a practice standpoint, some residual metal will form stringers or other residue at various locations on the die. Accordingly, a blanket etch without a mask is carried out in order to remove all stringers and other residue from the selected deposition process. The gate contacts 130 and 132 are therefore grown substantially taller than needed for the final embodiment, for example, in some embodiments twice as high as needed so that when a blanket etch back is performed without any mask, there is an assurance that all residue will be removed which is not at the desired location for the contacts 130 and 132. Since it is a blanket etch, preferably a wet etch, it will reduce the height of the gate contacts 130 and 132 while it removes the stringers. However, it is a timed etch to be of sufficient time to be ensured of removing all stringers and residue and not so long as to remove the gate contacts 130 and 132 at the desired locations.

Figure 5:
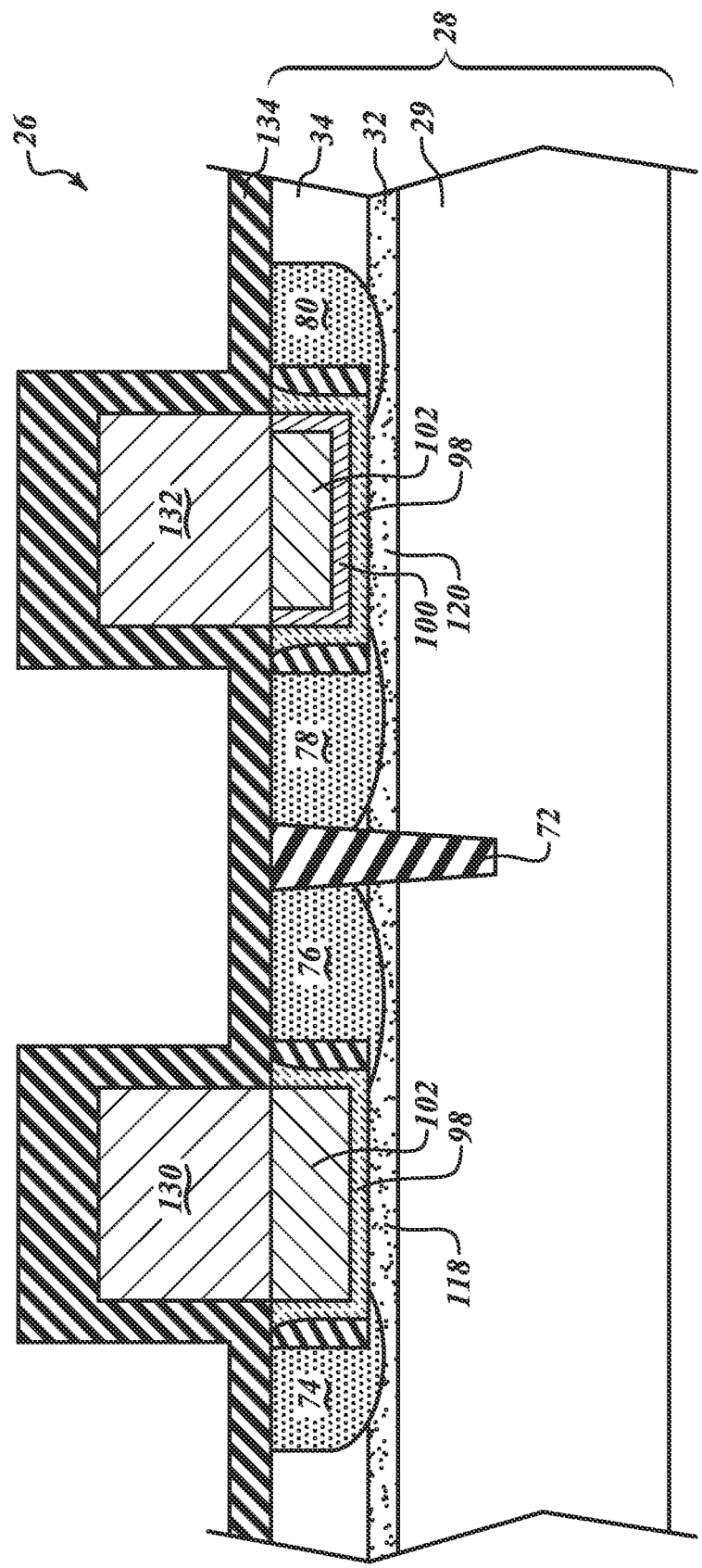

FIG. 5 illustrates a process of applying a gate metal encapsulator layer 134 over the surface of semiconductor device 26, according to an embodiment of the invention. The encapsulator layer 134 may be silicon nitride or silicon dioxide and is deposited to protect contacts 130 and 132, as well as any exposed portions of transistors 104 and 106. The encapsulator layer 134 may be similarly applied to a metal over silicon electroless deposition, a dielectric over silicon electroless deposition, or a dielectric over metal electroless deposition. The material used for the encapsulator layer 134 is selected to enable other layers to be used later in the process. In one embodiment it acts as a stop layer when etching other layers to facilitate opening contacts, as described later herein. When layer 134 is deposited, particular steps are taken in anticipation of a blanket etch of this layer 134. It is desired to etch the portion of layer 134 that is over the source/drain regions 74, 76, 78, 80 while leaving a layer 134 over the gate contacts 130, 132.

A first step which is carried out to assist in the process is that the top surface of source/drain implants are provided with a treatment so that when the layer 134 is deposited on the source/drain regions it will incorporate some additional material so as to have a faster etch rate than that portion of the layer which is on top of the metal 130, 132. As is known, when a silicon based layer is doped with a heavy dopant, such as boron, phosphorous, or other materials, it will etch significantly faster than undoped material. Such a treatment can be carried out for silicon nitride or silicon dioxide with the appropriate additional treatment material being provided at an upper surface of the source/drain regions when they are initially formed during the formation of the transistor, as shown in FIG. 1. This treatment can take place while the windows for the source/drain implant are opened and can be a final step which is performed after the source/drain implants have been made and after the appropriate anneal and heating steps but before removal of the source/drain mask. This stage of the process is shown in detail in FIG. 2 of the prior U.S. application Ser. No. 13/494,965, which is incorporated in its entirety by reference, as one example. Of course, mask openings for source/drain implants are well known in the art, and since this process can be used with any other processes besides the particular one which is incorporated by reference the treatment of the source/drain areas can be provided as a final step when the source/drain windows are open, as will be well known to those of skill in the art given the teachings herein.

During this surface treatment step, the mask is in place which covers where the gate electrode will be formed, and therefore the treatment material does not overlay the substrate at that location where the gate electrode will be formed and is positioned only over the source/drain regions. One example of a possible treatment material is a heavy dose of boron for the P-channel transistors and a heavy dose of phosphorous for the N-channel transistors. This final heavy dose is left at the very top surface of the source/drain regions and is not subjected to a heating and drive step. Accordingly, when the layer 134 is later formed, the doping material will uptake into the silicon based layer 134 and it will subsequently have a faster etch rate over those portions which are over the source/drain region since it contains a dopant. Other materials can be used for layer 134 in order to provide a differential etch rate of the layer 134 which is positioned over the source/drain regions, such other materials being known to those of skill in the art, and any such materials that provide for differential etch rates of the layer 134 are acceptable. For example, instead of silicon nitride, the deposition mask can be a high density oxide or BPSG oxide, both of which are known to have differential etch rates based on the local doping concentration. In addition, a silicon dioxide, if formed in the presence of heavy boron or phosphorous is well known to uptake the material during the formation process, and thus become appropriately doped. Accordingly, in one embodiment, instead of silicon nitride, an oxide is used for layer 134, which will have a differential etch rate over the source/drain than it does with respect to other locations in the same oxide layer, such as over the metal gate contacts in order to provide the differential etch, as will be explained later herein.

In addition, during the deposition of silicon nitride layer 134, there exists the CVD corner effect, in which silicon nitride will be deposited somewhat more thick on top of the metal layer than on the source/drain regions. The process is modified by adjusting the bias to enhance this growth deposition so that the layer 134 will grow more rapidly on the top of the metal area and be somewhat thicker over the metal gate contact 130, 132 than over the source/drain regions on the substrate 34. This difference can be seen in FIG. 5, in which the thickness of the layer 134 is greater on top of the metal contacts 130 and 132 than it is over the substrate 34 over the source/drain region locations.

An additional step that can be taken prior to the deposition of the layer 134 is to slightly roughen up the surface of the source/drain regions while the region is exposed. If the surface is slightly roughened, this will reduce the density of the silicon nitride or silicon dioxide as it is deposited on the substrate; however, as deposited on top of the metal gate the density will be greater. Therefore, when etched, the etch rate of the silicon nitride layer 134 over the substrate will be more rapid than over the gate electrode.

It is also possible to control the substrate electrical bias in order to improve the selectable etchability of the portion of the layer which is on the substrate as compared to the layer which is on top of the gate. When the layer 134 is formed, the electrical bias can be controlled during the deposition process in order to have thicker growth at the top of the gate contacts 130 and 132 than the layer 134 that is on the substrate. Also, when the layer 134 is etched, in FIG. 9 the electrical bias can be controlled to etch the portion of the layer 134 that is on the substrate, than the portion which is over the gate contacts 130 and 132.

Figure 6:
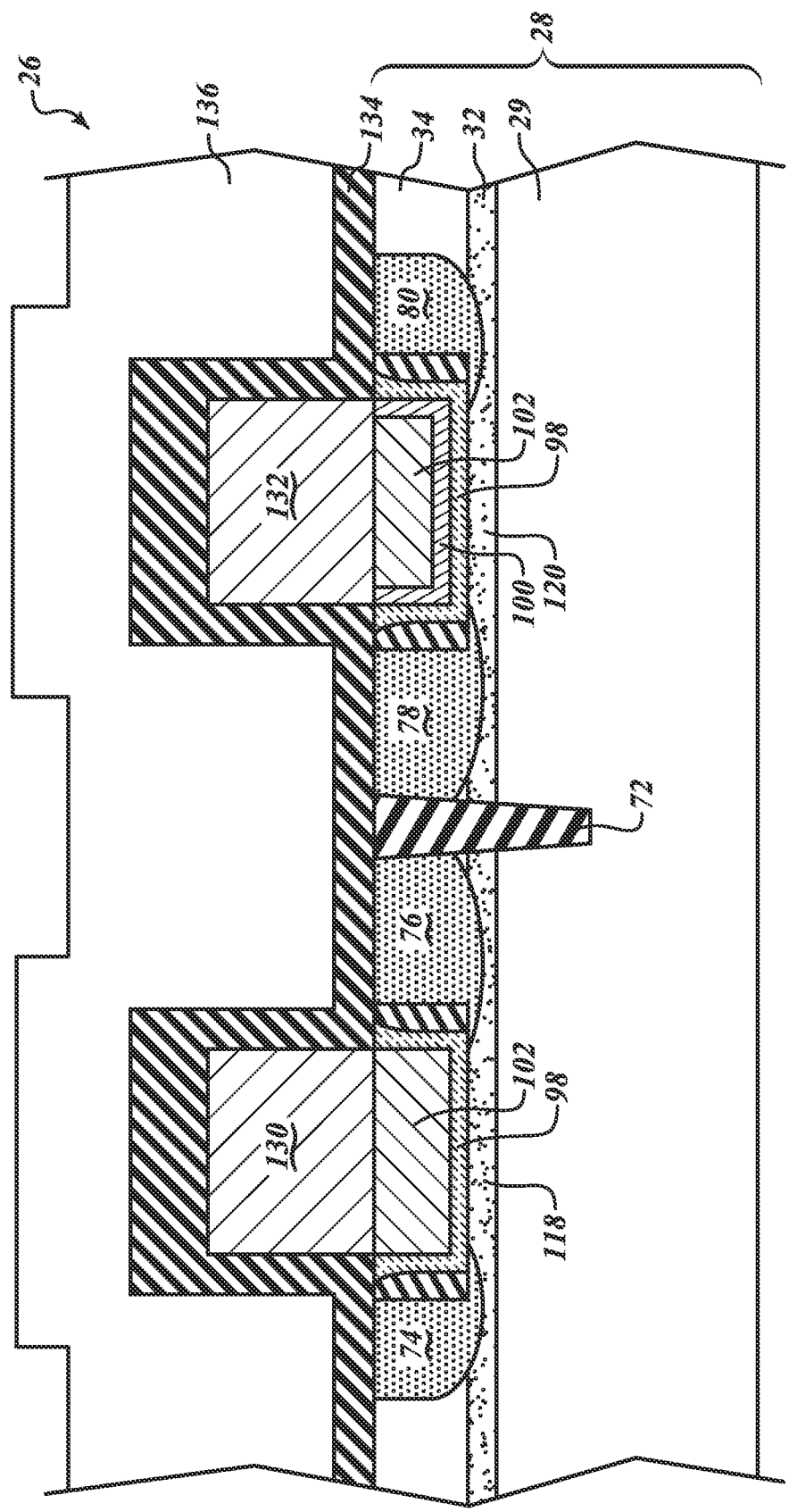

FIG. 6 illustrates a process of depositing an oxide layer 136 over the encapsulator layer 134. A blanket deposition to a desired height is carried out. The height is preferably above the topmost portion of layer 134 at all locations so that a layer 136 can be planarized in a CMP. Layer 136 is therefore a planarizing layer. Layer 136 can act as a planarizing layer in two respects. First, it fills in the recesses more quickly than it covers the top of the high features and thus creates a more planar surface. This can be accomplished by depositing an undoped silicon glass layer, sometimes called a USG or an undoped silicon dioxide, followed by deposition of a PSG or BPSG layer that is highly planar and can be reflowed after deposition to be more planar. Second, after forming layer 136, it is subjected to a blanket etchback with a CMP, so that layer 136 acts as a planarizing layer in the CMP step.

Figure 7:
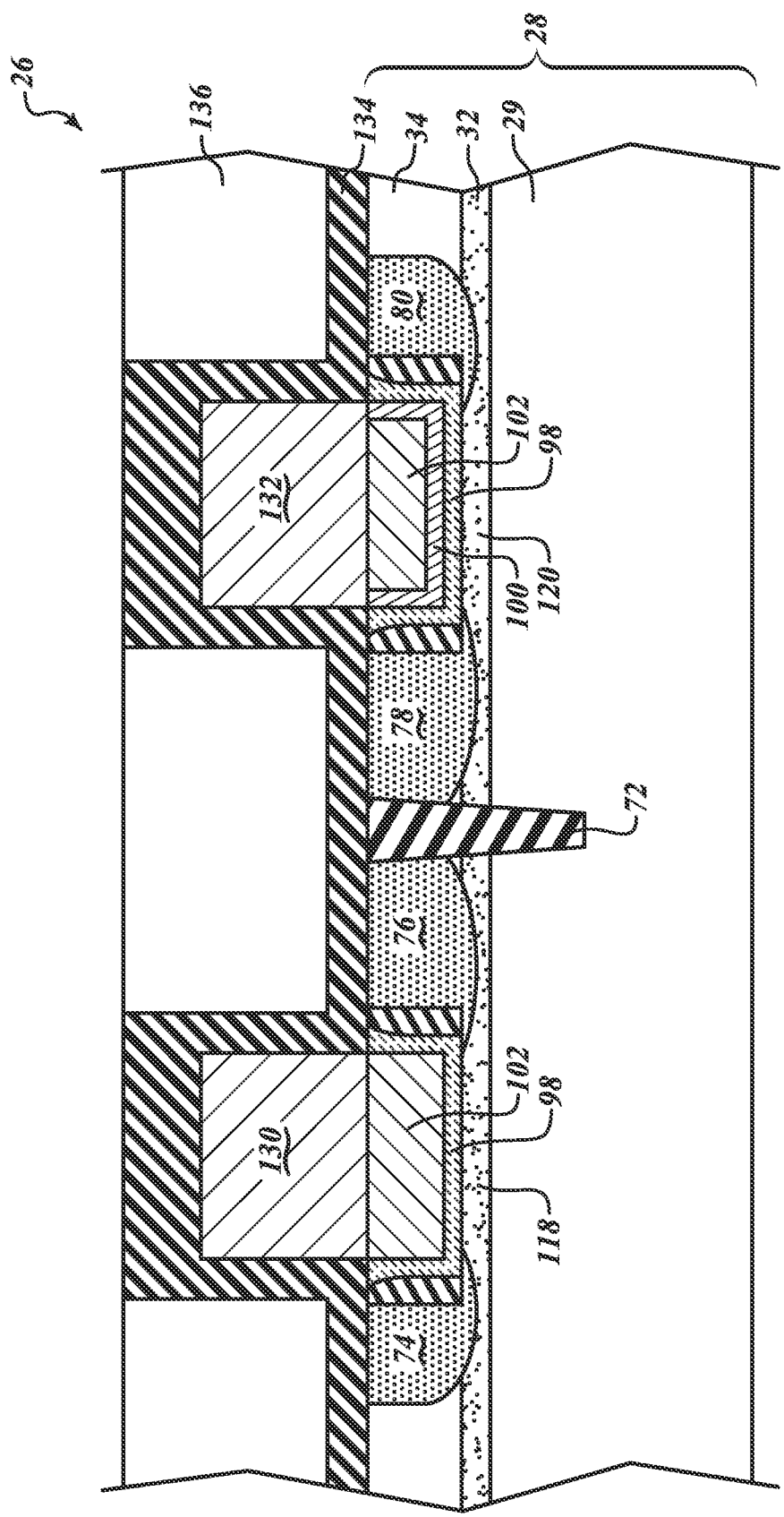

FIG. 7 illustrates a process of performing a chemical mechanical planarization (CMP) of oxide 136. The previously deposited encapsulator layer 134 is used as an etch stop layer, according to an embodiment of the invention. The liquid of the CMP is monitored during the CMP until a sufficient amount of the encapsulator layer 134 is detected. One a sufficient amount of encapsulator layer 134 is detected, the CMP process is terminated.

Figure 8A:
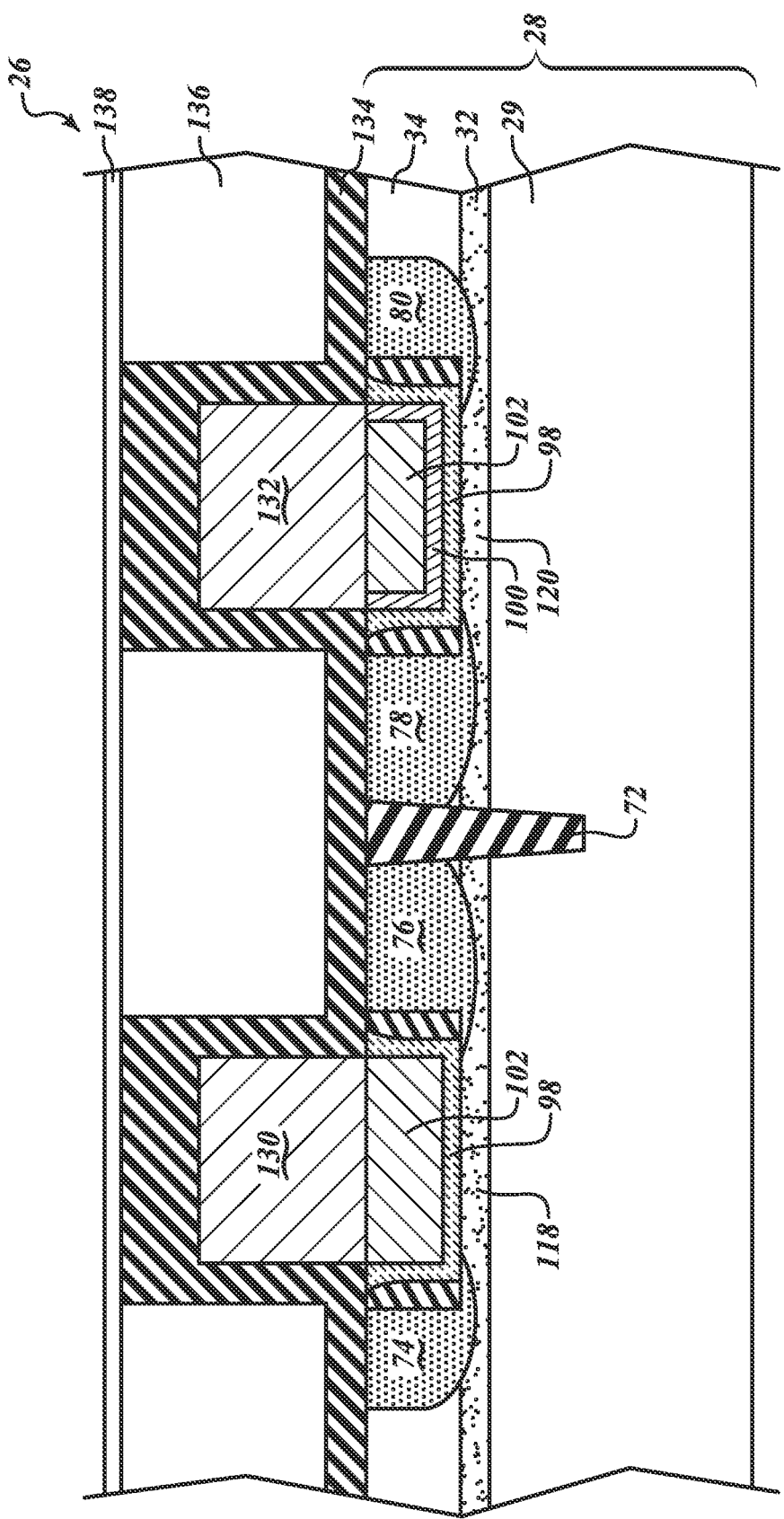

FIG. 8A illustrates depositing a hard mask 138 over the encapsulating layer 134 and contact oxide 136. The hard mask deposition facilitates etching openings to regions of FETs 104 and 106, such as to source and drain regions.

The hard mask 138 is preferably formed as a blanket deposition over the entire wafer. In a preferred embodiment, the hard mask is a type of nitride. In a first embodiment, titanium nitride, TIN, is used as the hard mask. Alternatively, a silicon nitride or tantalum nitride may be used. Use of tantalum nitride is preferred if the gate contact is copper.

Figure 8B:
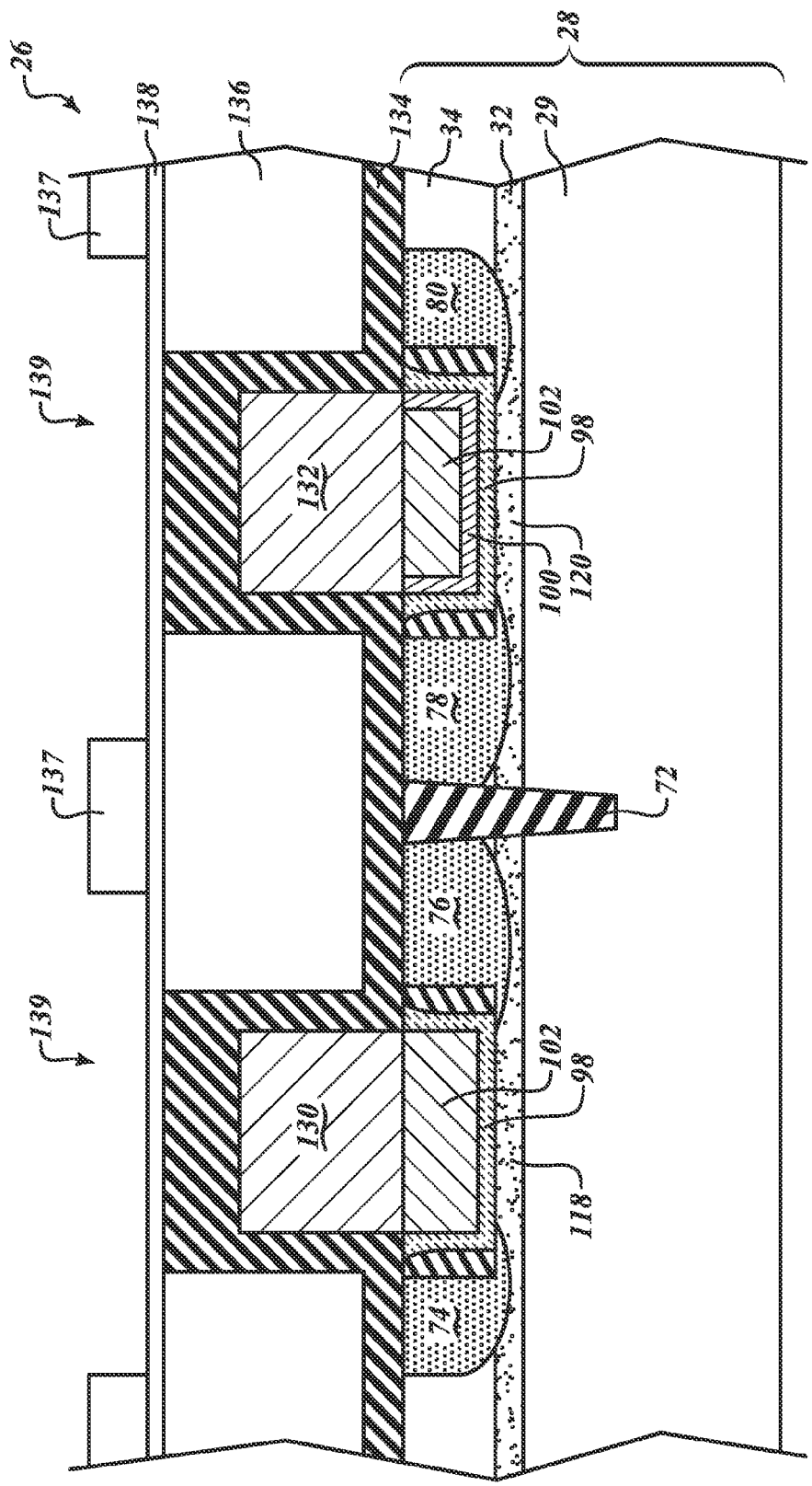

FIG. 8B illustrates a masking layer 137 which has been formed overlying the hard mask 138. The masking layer 137 may be a photoresist or any other appropriate masking layer which is patternable using photolithographic techniques. The mask 137 has openings 139 over those locations where the source/drain contacts will be located.

As can be seen by viewing the opening 139, it is sufficiently large to completely cover the gate contact 132 as well as those portions of the source and drain to which a contact opening will be formed for the same transistor. Since one gate contact 132 is very small, and in many cases will be smaller than the minimum line width which can easily be formed by a photoresist mask, the particular structure as described herein which permits a single opening to be used for both the source and the drain and which completely overlaps the gate is particularly advantageous. Thus, contacts can be made to the proper locations even when such contacts are smaller than the minimum dimension line with it can be formed for a particular process.

FIG. 9 illustrates a process of etching through hard mask 138, encapsulating film 134, and oxide 136 to form openings 140 to regions of FETs 104 and 106, such as source and drain regions. This process includes applying a photoresist 137, developing and removing some of the hard mask 138 at the desired openings 139 to create openings 140 as described with respect to FIG. 8B. According to one embodiment, the etch process used is an anisotropic reactive ion etch (RIE), which first etches through openings 139 to remove layer 138. The etch then removes layer 136. The etch chemistry is charged to etch away removes sections of encapsulating film 134 that are covering source/drain regions of FETs 104 and 106 while leaving a layer of encapsulating film 134 sidewalls and over the gate contacts intact.

The openings 140 are formed using standard photolithographic techniques and a photoresist which is exposed in a selected pattern and then etched to be removed which leaves openings 141 through which the oxide layer 136 is subjected to a blanket etch that is highly selected to just the oxide layer 136 and does not etch the nitride protective layer 134. As can be seen in FIG. 9, the openings 140 are extremely large as compared to the width of the gate electrode, which corresponds to the channel length. Namely, the openings 140 will be sufficiently large as to include the entire transistor of the source, the drain and the gate electrode. Because the transistors 104 and 106 are formed using particular techniques by which the features can be substantially smaller than the photolithographic process, it is not possible at the stage of FIG. 9 to form a mask that is open only over the source or only over the drain. Further, the gate electrode itself will have dimensions substantially smaller than can be selectively and properly aligned with photolithographic technique, which is one of the problems solved by the present invention as described herein. Thus, even though the individual particular features of the source, the drain and the gate electrode are each smaller than the standard photolithographic process can be properly aligned with the mask, together, they form a single transistor and the size of one entire transistor is sufficiently large that the line width of the available photolithographic process can be properly formed and correctly aligned over individual transistors. Thus, a blanket etch which selectively removes all of oxide layer 136 can be used which stops on layer 134 is acceptable because then nitride layer 134 covers the top of the gate contact and therefore it is not exposed during the blanket etch of layer 136.

The present invention therefore provides the convenient possibility of using a single mask to open up both the source and the drain contacts at the same time using the same opening for the same feature size in the photolithographic process.

During the etching as carried out in FIG. 9, after layer 136 is etched to expose layer 134, the etch chemistry is changed and a blanket etch of layer 134 is carried out in order to expose the source/drain regions. As has been previously described, two preparation steps were carried out in order to ensure that the source/drain regions were exposed during the blanket etch while the layer 134 on top of the gate electrodes 130 and 132 is not fully removed and the gate contacts are not exposed. As can be seen by comparing FIG. 9 to FIG. 8B, the thickness of the layer 134 over the gate contacts has been reduced somewhat, but is still sufficiently thick to protect the gate contact.

As previously described, prior to the deposition of layer 134, the substrate region over the source/drain regions was provided with a special treatment so that when the silicon nitride layer (or silicon dioxide) was later etched in the blanket etch of FIG. 9 it will have a faster etch rate over the source/drain regions than on top of the metal gate, which does not receive the special treatment. In addition, as previously described with respect to FIG. 5 during the deposition of the silicon nitride layer 134 the differential deposition rate was enhanced to increase the height of the deposition over the metal gate contacts 130 and 132 so that it has a somewhat thicker layer than the same layer 134 on the substrate. These two effects combine to provide the result that when a blanket etch of layer 134 is carried out as shown in FIG. 9 for openings 140, that the layer 134 over the substrate will be completely etched away and fully removed to expose the substrates, and while some of the layer 134 on top of the gate electrodes 130 and 132 will be removed so that it becomes thinner, a sufficient material 134 will remain over the gate electrodes to fully insulate them from later steps and electrically isolate them from a conductive layer to be deposited on the source/drain regions. Accordingly, the combination of the differential etch rate of the layer 134 over the source/drain regions as well as the difference in thickness of the deposition combine to assure that all of layer 134 will be removed over the source/drain regions but only some of the layer 134 on top of the gate of contacts 130 and 132 is removed. As previously mentioned, layer 134 is preferably made of the silicon nitride; however, alternatively it may be made of a silicon dioxide which has a different density and other properties so that it is selectively etchable with respect to oxide layer 136. Namely, if an oxide layer is used for 134, it would be desirable to etch layer 136 at the mask openings 140 with an etch that is preferential to not etch layer 134. Once layer 134 is fully exposed, then the etch chemistry is changed so as to rapidly etch layer 134 with a very slow etch rate of 136.

As can be seen in FIG. 9, the area opened by etch 140 corresponds to the opening 139 in the mask layer 137 and extends on both sides of the gate contact so as to open the source/drain regions simultaneously with protecting the top portion of the gate contact which is covered by the silicon nitride layer 134.

After the blanket etch is completed, source/drain openings 141 will be provided to the substrate.

Figure 10:
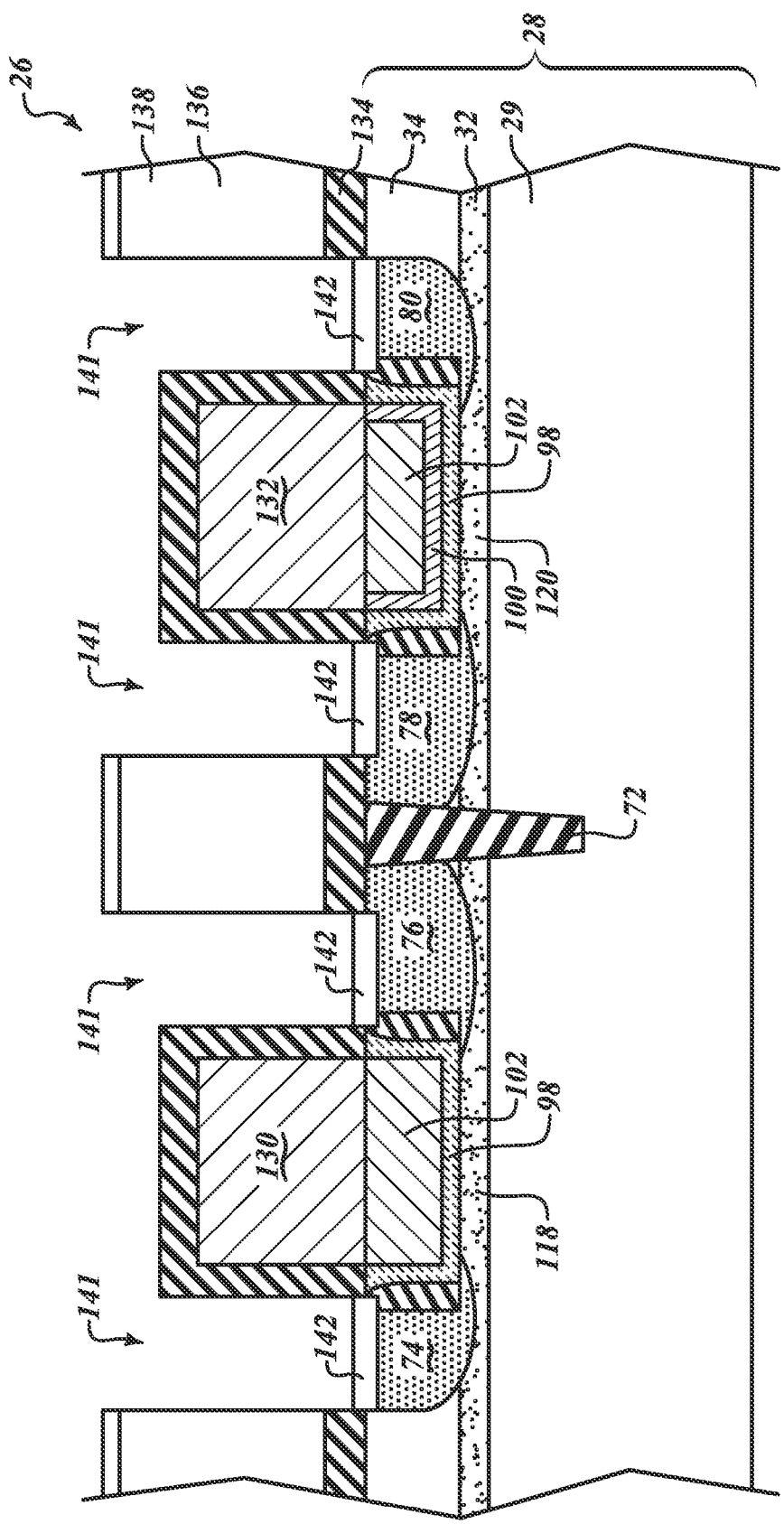

FIG. 10 illustrates a process of applying a silicide layer 142 to regions of the FETs, such as source and drain regions. The application of silicide layer 142 creates a low resistance connection to the regions of FETs to which it has been applied.

The preferred material for the silicide layer 142 is nickel so as to form a nickel silicide. Nickel silicide has been found acceptable for very low temperature application and transition to the silicide phase, and it has also been demonstrated that it can be deposited into very small openings. Therefore, a preferred material for the silicide layer 142 is nickel silicide. Alternatively, a titanium silicide, tantalum silicide, or a palladium silicide may be used.

Figure 11:
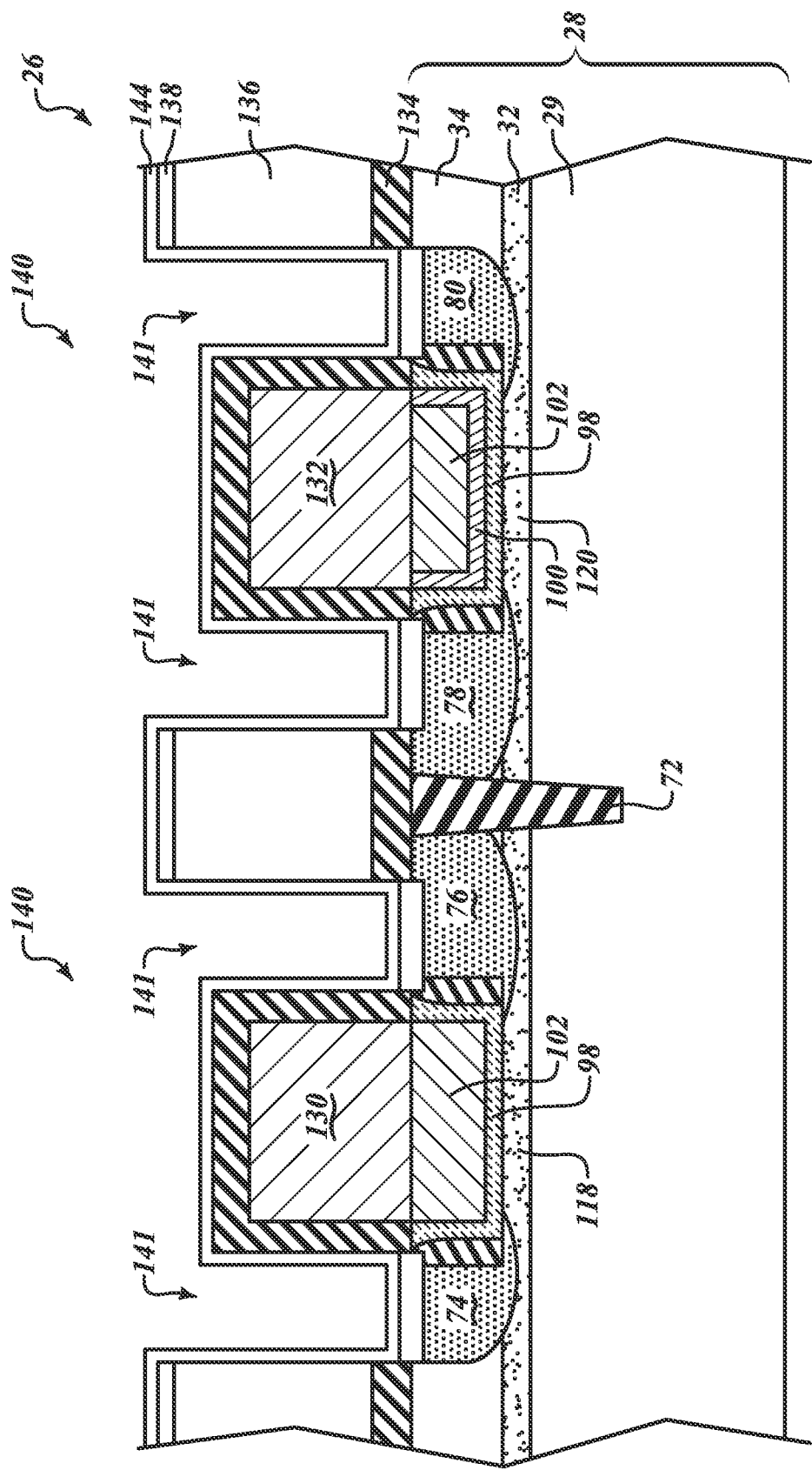

FIG. 11 illustrates a process of depositing a liner layer 144 in preparation for the deposition of a contact metal to the source and drain. Layer 144 is preferably a sandwich of titanium and titanium nitride, a commonly used liner known as Ti/TiN. In the event the metal that will be forming the source/drain contacts is copper, the liner 144 also includes a barrier layer that will have a barrier metal that will block copper from leaving the opening, such as tantalum, and may include a TaN layer of sufficient density and thickness to provide a barrier to copper entering the silicon layer 34.

Figure 12:
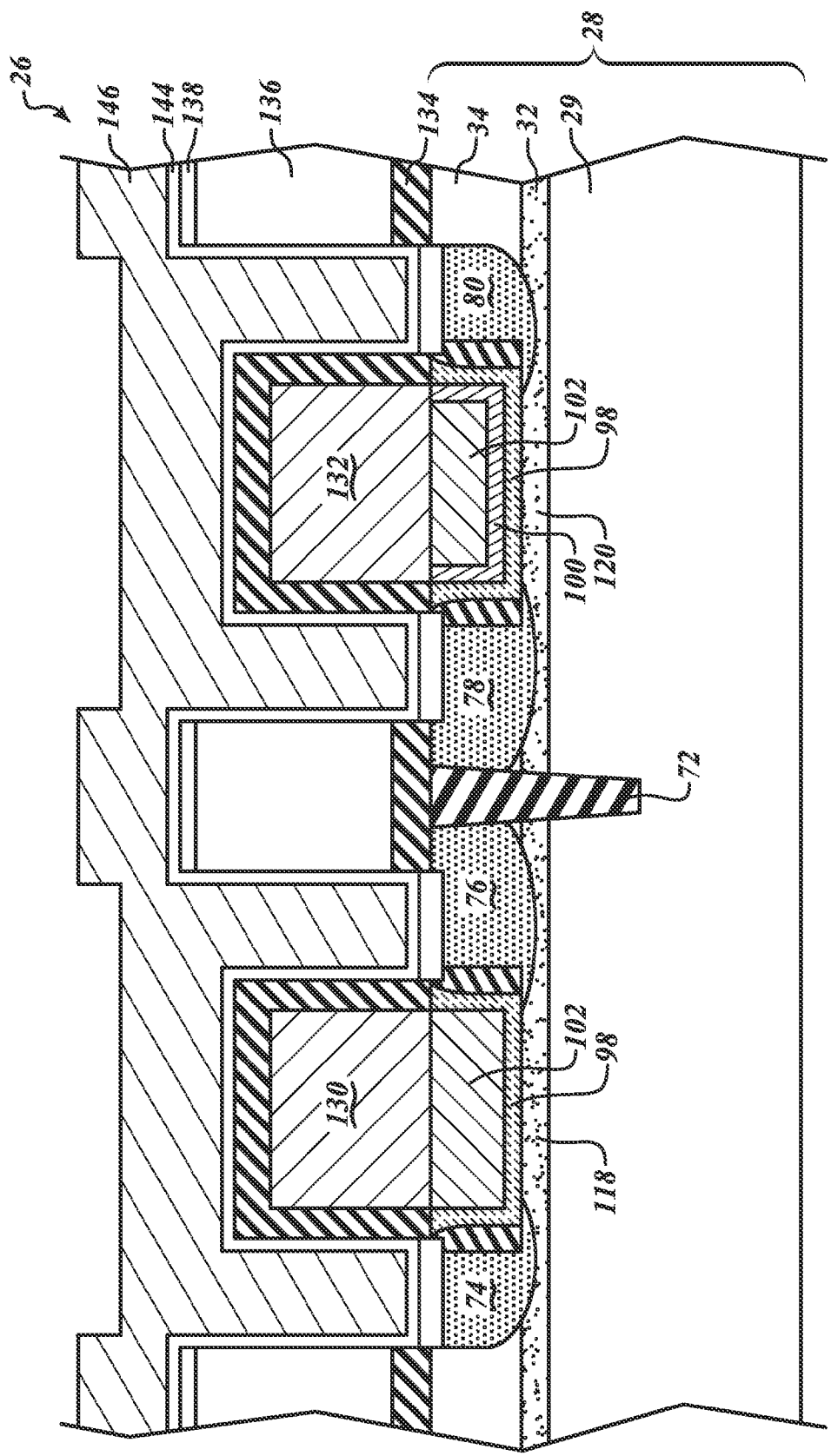

FIG. 12 illustrates a process of depositing a layer of contact metal 146 to fill openings 140. In one embodiment, the contacts 130 and 132 are formed from a different metal than the contact metal 146, so that the metal of contacts 130 and 132 or the metal of contact metal 146 may be used as an end of etch layer during subsequent CMP processes, according to one embodiment of the invention.

Figure 13:
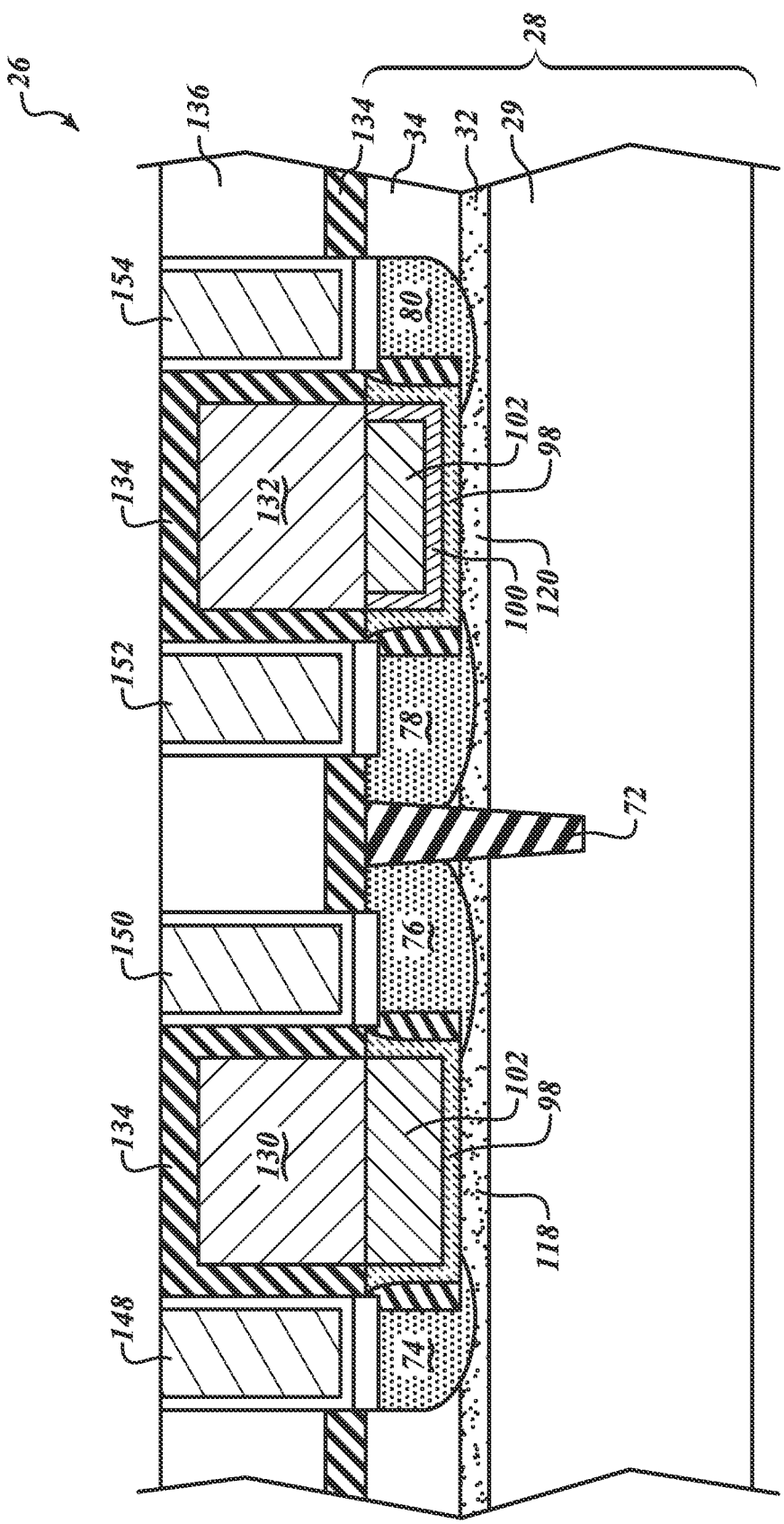

FIG. 13 illustrates performing a CMP to isolate and open contacts 148 and 150, associated with FET 104, and to open contacts 152 and 154, associated with FET 106. The CMP illustrated in FIG. 13 may use oxide 136 or encapsulating film 34 as a stop layer.

In most embodiments, FIG. 13 is now at the stage at which additional metal interconnection layers will be formed on the substrate 28, as conductive lines to connect various transistors and circuits to each other.

Standard techniques available for interconnect layers can be formed overlying oxide layer 136. Such interconnect layers may include low k dielectrics, copper wiring lines, and other types of interconnect structure well known in the art.

Electrical contact is made to the gate contacts 130 and 132 at an opening which is out of plane to that shown in FIG. 13. Namely, at a location which is either behind or in front of the cross sections shown in FIG. 13, an opening is made through the layer 134 in order to provide access to the gate contacts for electrical connection to higher levels and the metal wire layer. Accordingly, the wiring interconnects to the gate contacts can be made wider and at a location in which the source/drain contacts 148-154 are covered with an insulator so that appropriate photolithographic techniques can be used to access the gate contact without shorting the gate to its own source and drain.

Figure 14:
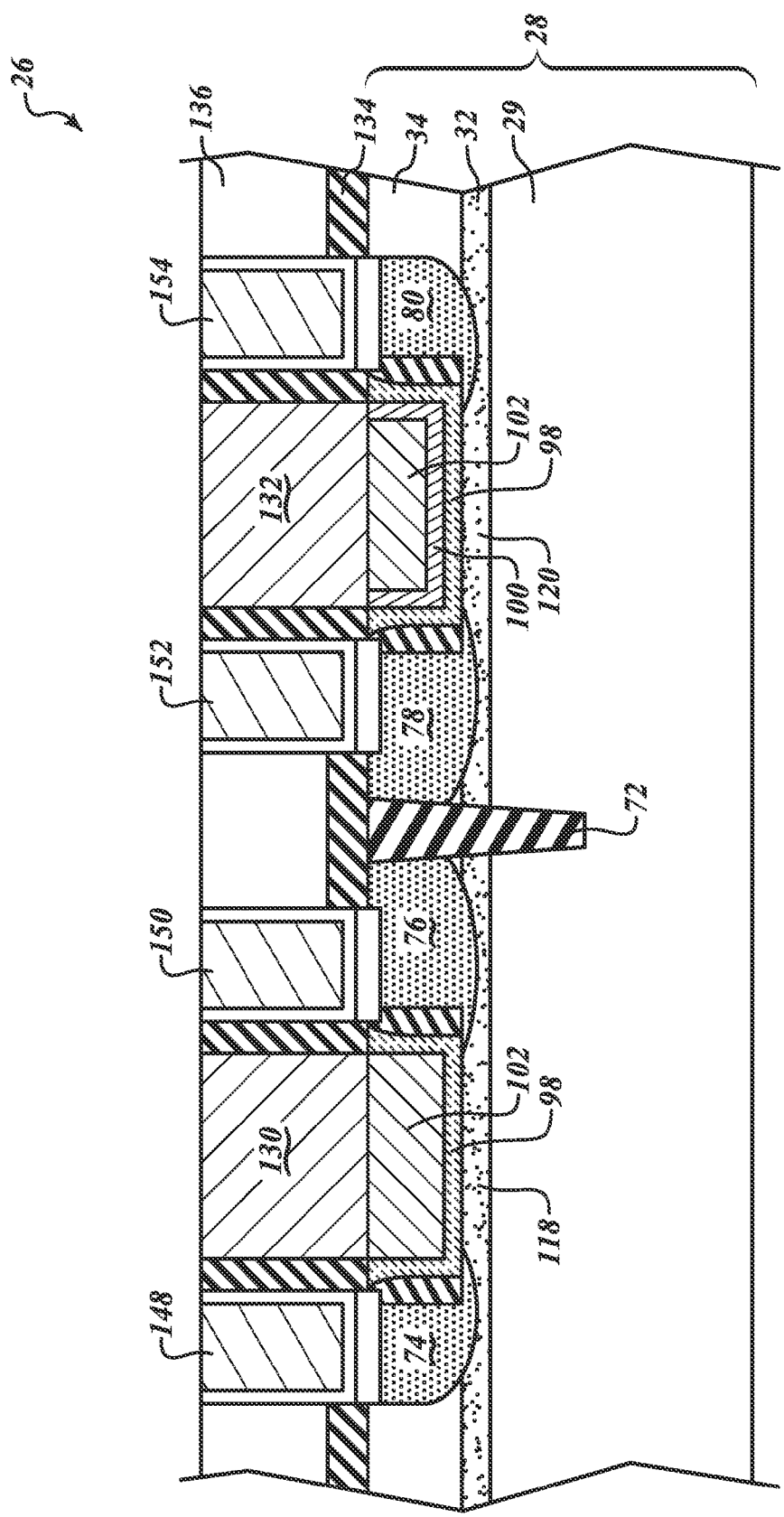
FIG. 14 illustrates an alternative embodiment for exposing source drain and gate contacts.

FIG. 14 illustrates performing a CMP in an alternative embodiment in order to open gate contacts to 130 and 132 at the same time as opening contacts 148, 150, 152, and 154 to other regions of FETs 104 and 106. Because in some embodiments, the contacts 130 and 132 may be formed with a metal, such as nickel, that is different than the metal used to form contacts 148, 150, 152, and 154, e.g., copper, tungsten, or aluminum, the metal of contacts 130 and 132 can be used as an etch stop layer to simultaneously open all contacts with a single CMP. This efficient CMP process may reduce the overall process fabrication time by eliminating steps that may have been needed to open the contacts 130 and 132 after having opened the other contacts 148, 150, 152, and 154. Alternative to layer 132 being an etch stop layer with respect to layer 154, it can be an end of etch indication layer. Namely, while the structure shown in FIG. 13 is subjected to a universal etch chemistry in a CMP etch, all exposed layers will etch at a generally uniform etch rate. When layer 130 is reached, this will cause a new chemical, such as nickel, to appear in the etch residue. This will be used as an end of etch marker to indicate that the gate contacts have been reached and after some small additional etch, such as a 10% overetch to ensure that all gate contacts of all transistors are exposed, the etch is completed to obtain the structure shown in FIG. 14.

Figure 15:
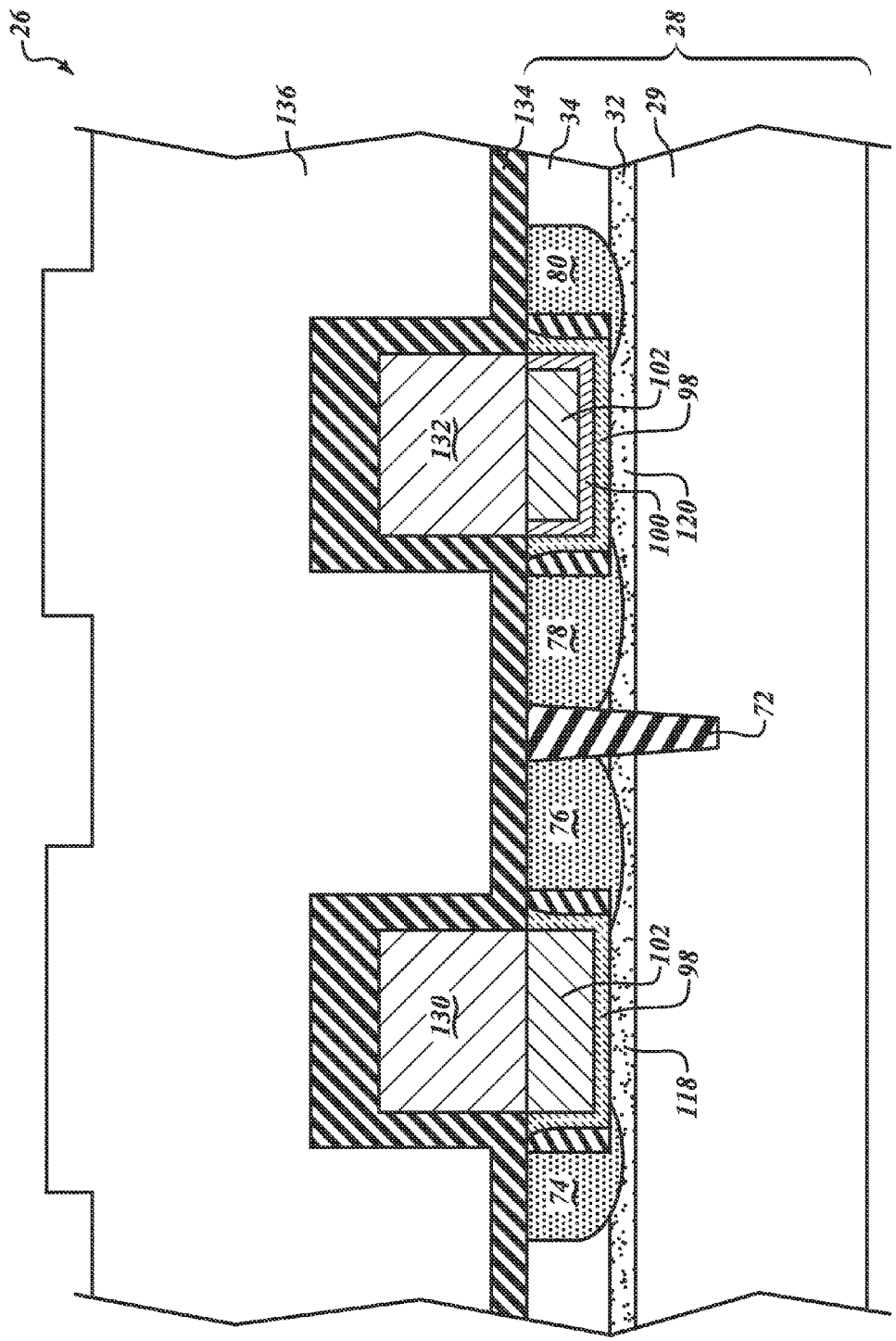
FIGS. 15-18 illustrate an alternative embodiment for forming source, drain and gate contacts as taught herein.

FIGS. 15-18 illustrate an alternative embodiment for forming the contacts to the source/drain. The stage in the process in FIG. 15 corresponds to FIG. 6 of the first embodiment. Up until this stage in the process in FIGS. 3-6 the same process steps are carried out to form the same structure and therefore they will not be repeated. At stage 6, there is a modification of the process for a new embodiment as will now be explained and shown with respect to FIGS. 15-18. In the embodiment of FIG. 15, the dielectric oxide 136 is deposited somewhat thicker than in the first embodiment as shown in FIG. 6.

Figure 16:
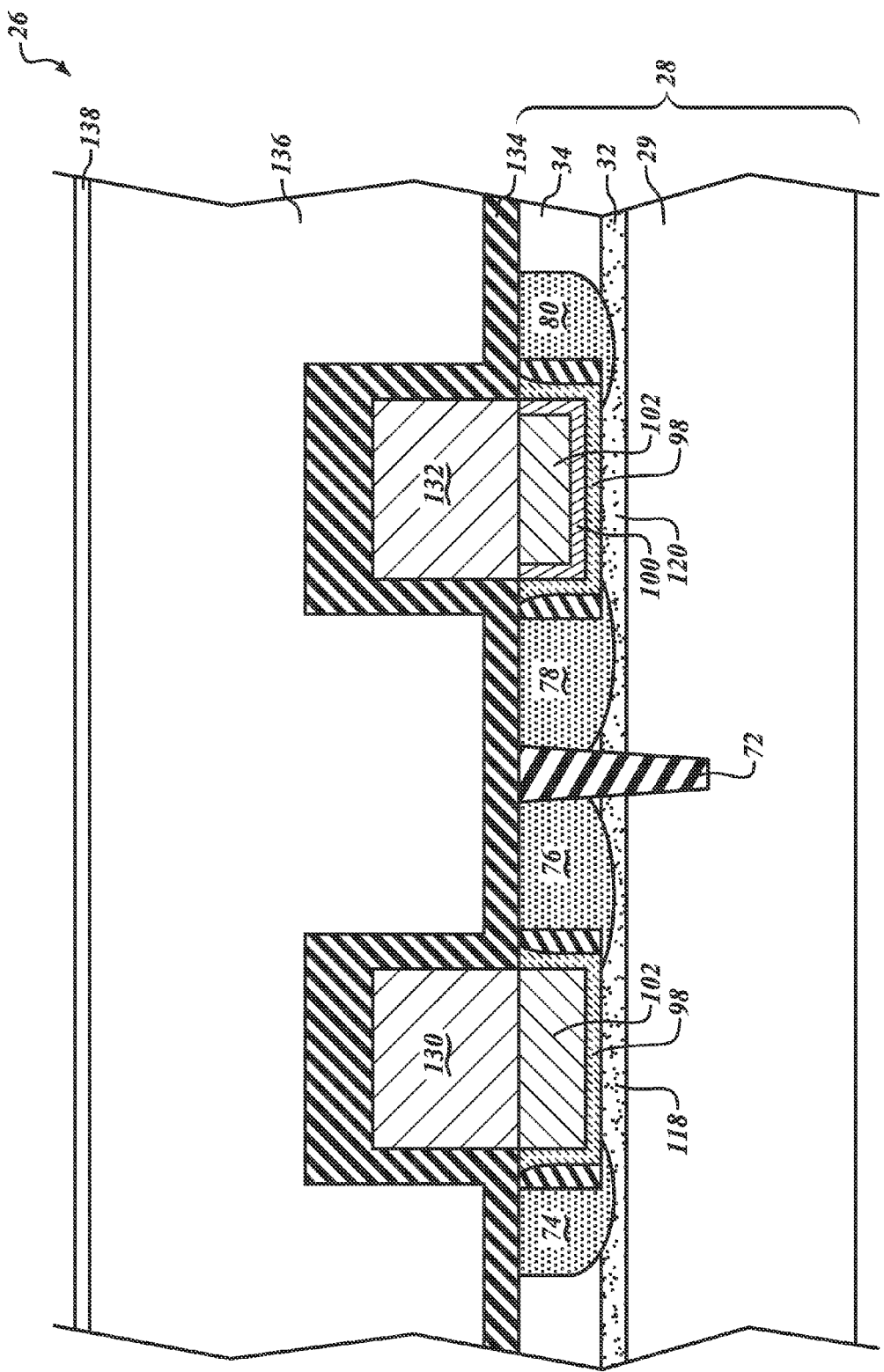
Figure 17:
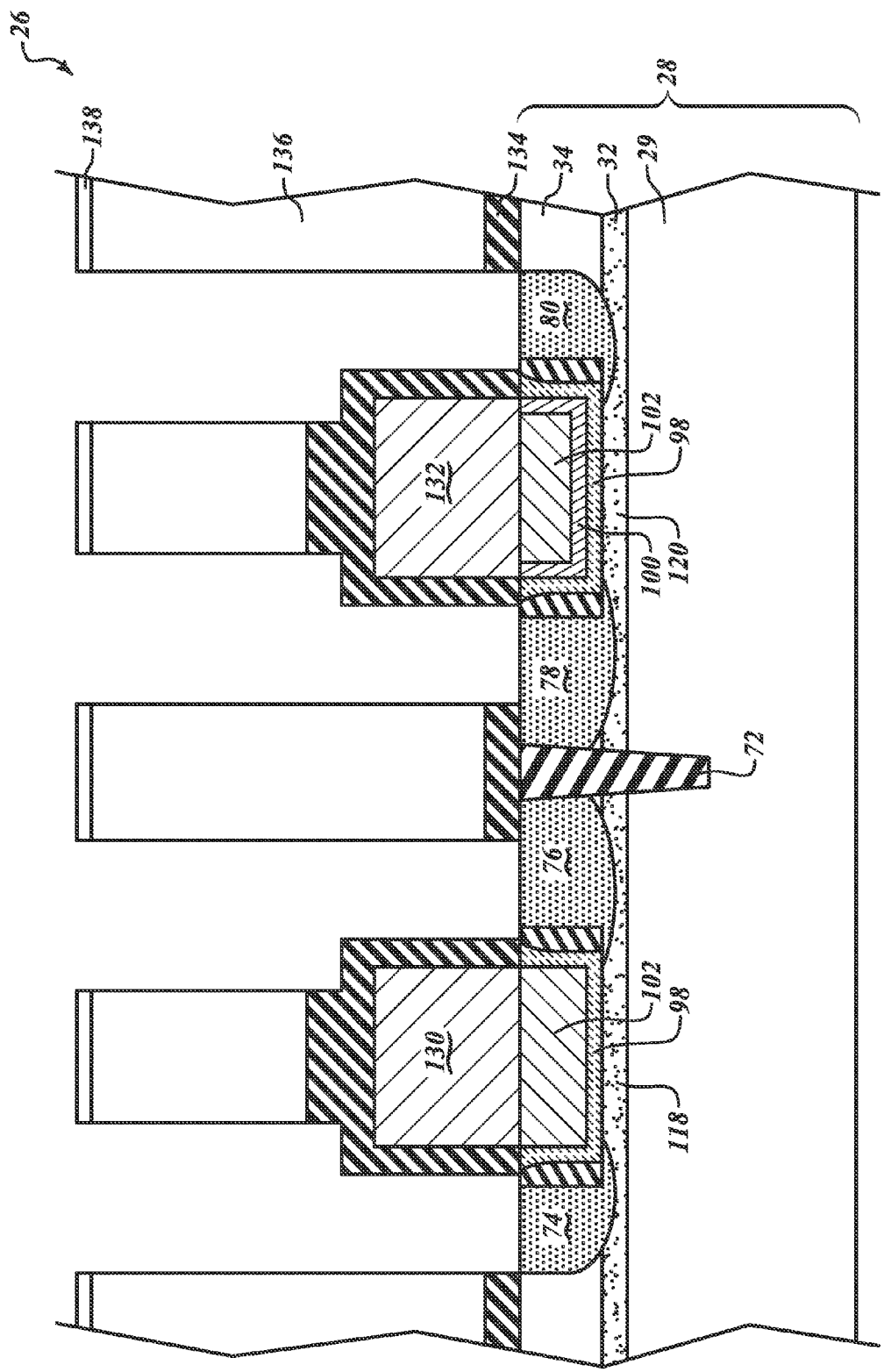

FIG. 16 illustrates that the layer 136 is planarized by an appropriate technique, such as CMP or other planarizing etch and deposit. An upper layer 138 is thereafter deposited on top of layer 136 as a hard mask similar to that shown in FIG. 8A at the first embodiment. The difference between the two embodiments can be seen by comparing FIG. 16 to FIG. 8A. In FIG. 8A, the oxide layer 136 is planarized until it is flush with the encapsulation layer 134, and the hard mask 138 overlays both the layer 136 and the gate contact encapsulation layer 134. For this particular process of FIG. 8A, it is only necessary that the layer 136 be sufficiently high that it is fully planarized when it reaches the same height as the gate encapsulation layer 134. On the other hand, as can be seen by comparing FIG. 16, the layer 136 is sufficiently high that when fully planarized it is still planarized it is still spaced some distance above the gate encapsulation layer 134 in this alternative embodiment. The amount of the distance is exaggerated in FIG. 16, and in practical application may be somewhat lower and be only a small distance above layer 134 over the gate. Following the deposition of hard mask 138, similar steps are carried out similar to that shown in FIGS. 8B-15. Namely, a mask 137, similar to that shown in FIG. 8B, is applied over the structure of FIG. 16, and openings 139 are formed. After this, an etch is provided which is selective for the oxide layer 136 and does not etch the gate contact encapsulation layer 134. After the layer 136 is etched and the layer 134 is reached, the etch chemistry is changed so as to etch layer 134. As in the embodiment shown in FIG. 9, the layer 134 has been formed to have a preferential etch rate on the substrate somewhat faster than over the metal areas in one embodiment. Alternatively, or in addition, the layer on top of the gate contacts 130 and 132 will be thicker so that even if the etch rate is the same, the source/drain contacts will be exposed prior to reaching the gate electrode.

Figure 18:
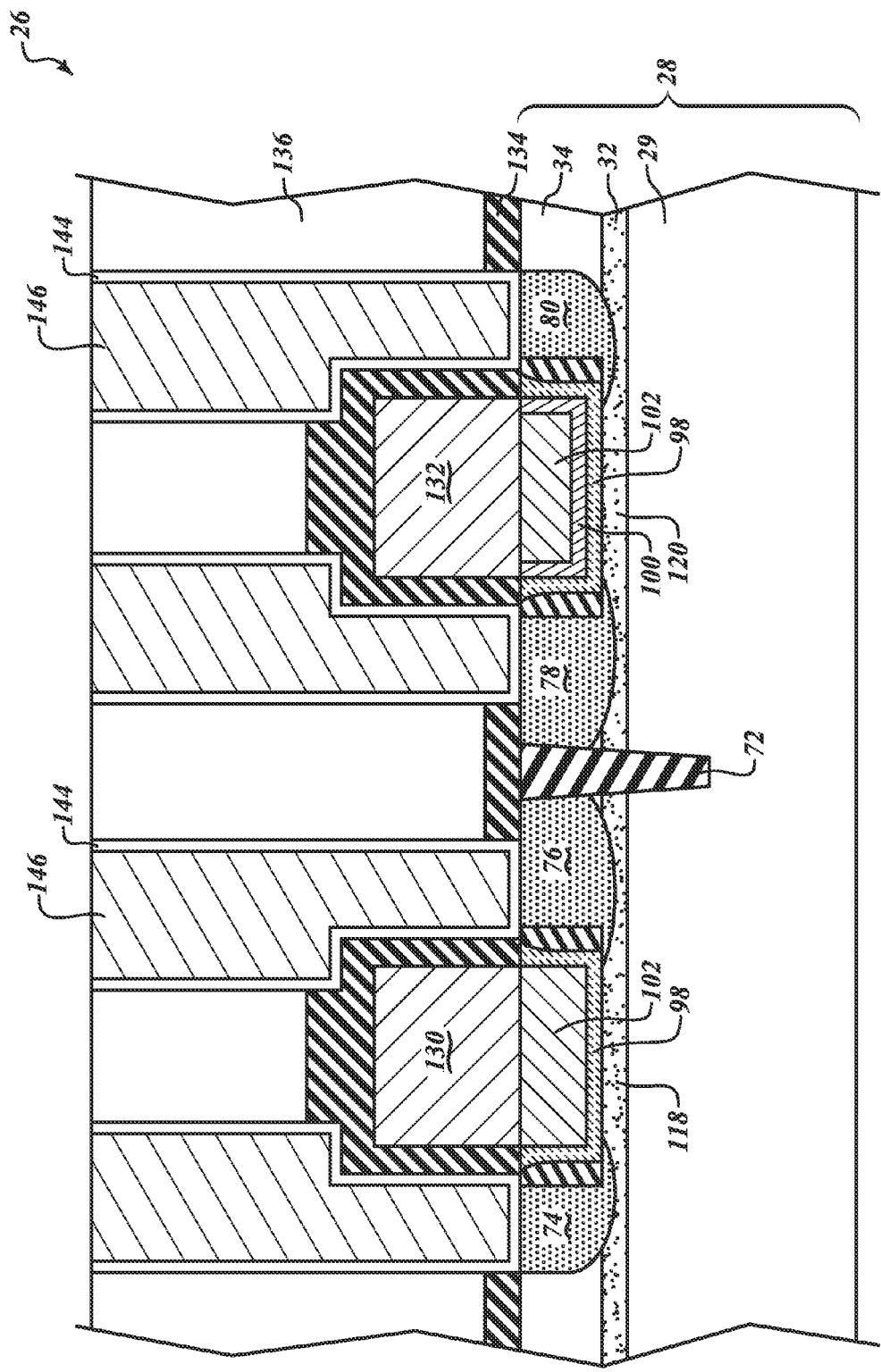

In FIG. 18 the same steps are carried out as shown in FIGS. 10-13, even though all the details are not shown in the simplified view of FIG. 18. Namely, the source regions will be silicided with a silicide layer similar to that as 142, and then a liner will be provided, similar to liner 144 followed by a planar etchback to provide access to the source/drain regions. As previously mentioned with respect to FIG. 13, the interconnection to the gate contacts 130 and 132 is made at a different location, out of plane with the cross section shown in FIG. 18.

One benefit of the embodiment of FIG. 18 is that the contacts 146 have an enlarged area which overlaps the gate contact 132 so that interconnection metals may be more easily aligned with the source and drain contacts. As can be seen, both the source and drains have an expanded upper surface which overlaps a portion of the gate electrode and the gate contact, and are separated therefrom by the encapsulation layer 134.

As shown in FIG. 18, the height of the source contact and the drain contact extends to be higher than the gate contact by an amount equal to the sum of the heights of the first insulating layer and the second insulating layer. In addition, the source contact and the drain contact both overlay the gate contact, the cross-sectional area of the source contact and the drain contact being greater in the region above the gate contact than in the region laterally adjacent to the gate contact. The area of the source and drain contacts expands to be over the gate contact to provide a greater surface area at the top region of layer 136. This is possible because there is an insulation layer 134 over the gate contact at the region where the source and drain contacts are made.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of making a semiconductor device comprising:
    forming a transistor by:
        forming a gate electrode over a semiconductor substrate;
        forming source and drain regions adjacent to the gate electrode in the semiconductor substrate;
    selectively forming a metal gate contact directly connected to the gate electrode, the gate contact being positioned over the gate electrode, the gate electrode being positioned over a channel region that is positioned between the source region and the drain region;
    performing a blanket etch of the substrate, without a mask present, and including performing the blanket etch on an exposed surface of the gate contact;
    forming a first insulating layer as a conformal deposition over the substrate and the gate contact;
    forming a second insulating layer as a planarizing layer over the first insulating layer;
    forming a pattern masking layer overlying the second insulating layer, the pattern masking layer having a patterned opening that extends as a single opening overlying the gate electrode and the source and the drain regions of the transistor;
    etching a single opening in the second insulating layer that extends across the source region, the drain region, and the gate electrode to provide access to the source and drain regions with the single mask opening.

2. The method according to claim 1 wherein the forming of the first insulating layer further includes causing a portion of the first insulating layer over the metal gate contact to be thicker than a portion of the first insulating layer over the source region and the drain region.

3. The method according to claim 2 further including:
    performing a blanket etch of the second insulating layer, without a mask, to expose the source region and the drain region of the transistor without exposing the gate contact.

4. The method according to claim 1 further including:
    performing a planarizing etch on the second insulating layer prior to etching the single opening.

5. The method according to claim 1 further including:
    depositing a hard mask overlaying the planarizing layer prior to forming the pattern masking layer, the hard mask being positioned between the planarizing layer and the pattern masking layer.

6. The method according to claim 1 wherein selectively forming the metal gate contact directly connected to the gate electrode includes:
    depositing a gate contact metal layer using a plating process.

7. The method according to claim 6 wherein the plating process is electroless.

8. The method according to claim 1 wherein selectively forming the gate contact directly connected to the gate electrode includes:
    depositing a gate contact metal layer using chemical vapor deposition.

* * * * *